(12) United States Patent
Kawamura et al.

(10) Patent No.: US 9,946,157 B2
(45) Date of Patent: Apr. 17, 2018

(54) RESIST COMPOSITION AND METHOD FOR PRODUCING RESIST PATTERN

(71) Applicant: SUMITOMO CHEMICAL COMPANY, LIMITED, Tokyo (JP)

(72) Inventors: Maki Kawamura, Osaka (JP); Makoto Akita, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/085,386

(22) Filed: Mar. 30, 2016

(65) Prior Publication Data

US 2016/0291464 A1    Oct. 6, 2016

(30) Foreign Application Priority Data

Mar. 31, 2015  (JP) ................. 2015-073000
Jul. 3, 2015   (JP) ................. 2015-134385

(51) Int. Cl.
| | | |
|---|---|---|
| *G03F 7/038* | (2006.01) | |
| *G03F 7/16*  | (2006.01) | |
| *G03F 7/20*  | (2006.01) | |
| *G03F 7/32*  | (2006.01) | |
| *G03F 7/039* | (2006.01) | |

(52) U.S. Cl.
CPC .......... *G03F 7/0397* (2013.01); *G03F 7/0392* (2013.01)

(58) Field of Classification Search
CPC .................................................. G03F 7/0392
USPC ........................................... 430/275.1–279.1
See application file for complete search history.

(56) References Cited

U.S. PATENT DOCUMENTS

| | | | |
|---|---|---|---|
| 3,779,778 A | 12/1973 | Smith et al. | |
| 3,849,137 A | 11/1974 | Barzynski et al. | |
| 4,576,902 A | 3/1986 | Saenger et al. | |
| 4,822,716 A | 4/1989 | Onishi et al. | |
| 4,857,437 A | 8/1989 | Banks et al. | |
| 5,017,453 A | 5/1991 | Onishi et al. | |
| 5,073,476 A | 12/1991 | Meier et al. | |
| 5,198,520 A | 3/1993 | Onishi et al. | |
| 5,260,410 A | 11/1993 | Schwalm | |
| 5,453,341 A | 9/1995 | Schwalm | |
| 2003/0219677 A1 | 11/2003 | Namba et al. | |
| 2007/0275320 A1* | 11/2007 | Washio ................. G03F 7/0382 430/270.1 |
| 2008/0153036 A1 | 6/2008 | Suetsugu et al. | |
| 2009/0068594 A1* | 3/2009 | Shimbori .............. G03F 7/0392 430/286.1 |
| 2010/0151380 A1 | 6/2010 | Ando et al. | |
| 2013/0330669 A1 | 12/2013 | Kawamura et al. | |
| 2015/0086927 A1 | 3/2015 | Sugihara et al. | |

FOREIGN PATENT DOCUMENTS

| | | |
|---|---|---|
| DE | 3914407 A1 | 10/1990 |
| EP | 0 126 712 A1 | 11/1984 |
| JP | 55-164824 A | 12/1980 |
| JP | 62-69263 A | 12/1980 |
| JP | 2010-204634 A | 11/1984 |
| JP | 62-153853 A | 7/1987 |
| JP | 63-26653 A | 2/1988 |
| JP | 63-146029 A | 6/1988 |
| JP | 63-146038 A | 6/1988 |
| JP | 63-163452 A | 7/1988 |
| JP | 2001-75277 A | 3/2001 |
| JP | 2003-98671 A | 4/2003 |
| JP | 2003-345024 A | 12/2003 |
| JP | 2004-347950 A | 12/2004 |
| JP | 2004-347951 A | 12/2004 |
| JP | 2008-46594 A | 2/2008 |
| JP | 2008-134515 A | 6/2008 |
| JP | 2010-79081 A | 4/2010 |
| JP | 2014-13381 A | 1/2014 |
| JP | 2015-87759 A | 5/2015 |

* cited by examiner

*Primary Examiner* — Cynthia Hamilton
(74) *Attorney, Agent, or Firm* — Birch, Stewart, Kolasch & Birch, LLP

(57) ABSTRACT

A resist composition contains: a novolak resin (A1) having a protective group capable of being cleaved by action of an acid, an acid generator (B), an anticorrosive agent (G), and a solvent (D) as well as a method for producing a resist pattern includes steps (1) to (4); (1) applying the resist composition according to the above onto a substrate; (2) drying the applied composition to form a composition layer; (3) exposing the composition layer; and (4) developing the exposed composition layer.

9 Claims, No Drawings

RESIST COMPOSITION AND METHOD FOR PRODUCING RESIST PATTERN

CROSS-REFERENCE TO RELATED APPLICATIONS

This application claims priority to Japanese Applications No. 2015-73000 and No. 2015-134385 filed on Mar. 31, 2015 and Jul. 3, 2015. The entire disclosures of Japanese Applications No. 2015-73000 and No. 2015-134385 are incorporated hereinto by reference.

BACKGROUND

1. Field of the Invention

The disclosure relates to a resist composition and a method for producing resist pattern.

BACKGROUND OF THE INVENTION

A resist composition which contains a resin having a novolak resin, an acid generator and an anticorrosive agent or plasticizer has been proposed as a resist composition used for micromachining of semiconductor processes, for example, the formation of wiring or a bump formed by plating, etc., in JP2004-347950A and JP2014-13381A.

SUMMARY

The present application provides the inventions as follow.

[1] A resist composition contains:
a novolak resin (A1) having a protective group capable of being cleaved by action of an acid,
an acid generator (B),
an anticorrosive agent (G), and
a solvent (D).

[2] The resist composition according to [1] wherein the resin (A1) has an acetal group.

[3] The resist composition according to [2] wherein the acetal group has a structure represented by —O—CH(CH$_3$)—O—.

[4] The resist composition according to [1] wherein the protective group is selected from the group consisting of an ethoxyethyl group, an isopropyloxyethyl group and cyclohexyloxyethyl group.

[5] The resist composition according to any one of [1] to [4] further comprising a novolak resin having no protective group.

[6] The resist composition according to any one of [1] to [5] further comprising a resin that has an acid-labile group and is different from the resin (A1).

[7] The resist composition according to any one of [1] to [6] wherein
the anticorrosive agent (G) is at least one selected from the group consisting of a sulfur-containing compound, an aromatic hydroxyl compound, a silicon-containing compound, a benzotriazol compound and a triazine compound.

[8] The resist composition according to [7] wherein the sulfur-containing compound is a compound having a mercapto group and a sulfide bond.

[9] The resist composition according to [8] wherein the compound having a mercapto group and a sulfide bond is a compound represented by formula (IA):

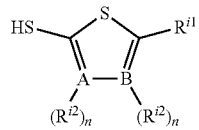

wherein $R^{i1}$ represents a hydrogen atom, a $C_1$ to $C_{10}$ aliphatic hydrocarbon group, a $C_3$ to $C_{18}$ alicyclic hydrocarbon group, a $C_6$ to $C_{14}$ aromatic hydrocarbon group, —$SR^{11}$ or —$N(R^{12})(R^{13})$;

$R^{11}$, $R^{12}$ and $R^{13}$ each independently represent a hydrogen atom, a $C_1$ to $C_{10}$ aliphatic hydrocarbon group, a $C_3$ to $C_{10}$ alicyclic hydrocarbon group, a $C_6$ to $C_{14}$ aromatic hydrocarbon group or a $C_1$ to $C_{12}$ acyl group;

$R^{i2}$ and $R^{i3}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

A and B each independently represent a nitrogen atom or a carbon atom; and

"n" and "m" each independently represent 0 or 1, or
a polymer having a structural unit that has a mercapto group and a sulfide bond in a side chain.

[10] A method for producing a resist pattern comprising steps (1) to (4);
(1) applying the resist composition according to any one of [1] to [9] onto a substrate;
(2) drying the applied composition to form a composition layer;
(3) exposing the composition layer; and
(4) developing the exposed composition layer.

DETAILED DESCRIPTION OF DISCLOSURE

In the specification, the term "(meth)acrylic monomer" means a monomer having a structure of "CH$_2$═CH—CO—" or "CH$_2$═C(CH$_3$)—CO—", as well as "(meth)acrylate" and "(meth)acrylic acid" mean "an acrylate or methacrylate" and "an acrylic acid or methacrylic acid," respectively. The group described herein, which can take both the linear structure and branch structure, may be either. When stereo isomers exist, it includes all stereoisomers. The indefinite articles "a" and "an" are taken as the same meaning as "one or more".

The term "solid components" means components other than solvents in a resist composition.

<Resist Composition>

The resist composition according to the disclosure contains
a novolak resin having a protective group capable of being cleaved by action of an acid (which is sometimes referred to as "resin (A1)"),
an acid generator (which is sometimes referred to as "acid generator (B)"),
an anticorrosive agent ((which is sometimes referred to as "anticorrosive agent (G)", and
a solvent (which is sometimes referred to as "solvent (D)").

The resist composition of the disclosure may contain a resin that is different from the resin (A1) (which is sometimes referred to as "resin (A2)"), a quencher (which is sometimes referred to as "quencher (C)") and a surfactant, or the like.

Here, all of the resins contained in the resist composition are collectively referred to as "resin (A)".

<Resin (A1)>

The novolak resin having a protective group capable of being cleaved by action of an acid is a resin in which a phenolic hydroxyl group of the novolak resin has been protected by a protective group capable of being cleaved by action of an acid.

The novolak resin is a resin produced by addition condensation of an aromatic hydrocarbon having a phenolic hydroxyl group (which is sometimes referred to as "phenolic compound") with an aldehyde in the presence of an acidic catalyst.

Examples of the phenolic compound include phenol, o-cresol, m-cresol or p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 4-tert-butylcatechol, 2-ethylphenol, 3-ethylphenol, 4-ethylphenol, 2,5-diethylphenol, 3,5-diethylphenol, 2,3,5-triethylphenol, 2-naphthol, 1,3-dihydroxynaphthalene, 1,5-dihydroxynaphthalene, 1,7-dihydroxynaphthalene and a polyhydroxy triphenylmethane compound which can be obtained by condensation of xylenol and hydroxybenzaldehyde. These may be used as a single compound or as a combination of two or more compounds.

Among them, the phenolic compound is preferably o-cresol, m-cresol, p-cresol, 2,3-xylenol, 2,5-xylenol, 3,4-xylenol, 3,5-xylenol, 2,3,5-trimethylphenol, 2-t-butylphenol, 3-t-butylphenol, 4-t-butylphenol, 2-t-butyl-4-methylphenol and 2-t-butyl-5-methylphenol.

Examples of the aldehyde include aliphatic aldehydes such as formaldehyde, acetaldehyde, propionaldehyde, n-butylaldehyde, isobutylaldehyde, acrolein and croton aldehyde; alicyclic aldehydes such as cyclohexanealdehyde, cyclopentanealdehyde and furylacrolein; aromatic aldehydes such as furfural, benzaldehyde, o-, m- or p-methylbenzaldehyde, p-ethylbenzaldehyde, 2,4-, 2,5-, 3,4- or 3,5-dimethylbenzaldehyde, o-, m- or p-hydroxybenzaldehyde and o-, m- or p-nitrobenzaldehyde; and aromatic aliphatic aldehydes such as phenylacetaldehyde and cinnamaldehyde. These may be used as a single compound or as a combination of two or more compounds.

Among them, formaldehyde is preferred in view of easy industrial availability.

Examples of the catalyst for addition condensation include inorganic acids such as hydrochloric acid, sulfuric acid, perchloric acid and phosphoric acid; organic acid such as formic acid, acetic acid, oxalic acid, trichloroacetic acid and p-toluenesulfonic acid; divalent metal salts such as zinc acetate, zinc chloride and magnesium acetate. These may be used as a single compound or as a combination of two or more compounds.

The amount of the catalyst to be used is usually from 0.01 to 1 mole per mole of aldehyde.

The condensation reaction can be carried out in a known manner. The condensation reaction can be carried out at the temperature in the range of 60 to 150° C. for 2 to 30 hours. The condensation can be carried out in the presence of a solvent such as ethyl cellosolve and methylethylketone. After condensation reaction, a basic compound may be added thereto in order to neutralize the acid catalyst and remove the neutralized salt therefrom by washing with water.

The weight average molecular weight of the novolak resin is preferably 3,000 to 10,000, more preferably 6,000 to 9,000 and still more preferably 7,000 to 8,000. The novolak resin falling within these ranges can provide resin (A1) capable of leading to producing a film which effectively controls its thickness and the remaining residues after development. In the present specification, the weight average molecular weight is a value determined by gel permeation chromatography using polystyrene as the standard product. The detailed condition of this analysis is described in Examples.

There is no particular limitation on the protective group in the resin (A1) as long as the group is capable of being cleaved by action of an acid, and a known group may be given as examples of the protective groups. The protective group is introduced into some of the phenolic hydroxyl groups in the novolak resin produced by condensation as described above. Examples of the protective group include tert-butyl, tert-butoxycarbonyl, tert-butoxycarbonylmethyl, tert-butyloxyethyl, ethoxypropyl, ethoxybutyl, tetrahydro-2-pyranyl, tetrahydro-2-furyl, methoxyethyl, 1-ethoxyethyl, propyloxyethyl, cyclohexyloxyethyl, 1-(2-methylpropoxy) ethyl, 1-(2-methoxyethoxy)ethyl, 1-(2-acetoxyethoxy)ethyl, 1-[2-(1-adamantyloxy)ethoxy]ethyl, 1-[2-(1-adamantanecarbonyloxy)ethoxy]ethyl and 3-oxocyclohexyl group and 4-methyltetrahydro-2-pyrone-4-yl groups.

The protective group is preferably one selected from the group consisting of an ethoxypropyl, an ethoxybutyl, an ethoxyethyl, an isopropyloxyethyl, cyclohexyloxyethyl and 1-(2-methylpropoxy)ethyl groups, more preferably one selected from the group consisting of an ethoxyethyl, an isopropyloxyethyl and cyclohexyloxyethyl groups, still more preferably 1-ethoxyethyl group.

The resin (A1) preferably has an acetal group. The acetal group is generally represented by *—O—CH($R^{xa}$)—O—$R^{xb}$ where $R^{xa}$ and $R^{xb}$ each independently a $C_1$ to $C_{18}$ monovalent saturated hydrocarbon group, and * is a binding position to a phenolic group. Examples of the monovalent saturated hydrocarbon group for $R^{xa}$ and $R^{xb}$ include a $C_1$ to $C_{12}$ alkyl group such as methyl, ethyl, propyl, isopropyl, butyl, pentyl, hexyl, heptyl and octyl groups; a $C_3$ to $C_{12}$ monocyclic hydrocarbon group such as cyclopentyl, cyclohexyl, cycloheptyl and cyclooctyl groups; a $C_5$ to $C_{18}$ polycyclic hydrocarbon group such as decahydronaphthyl, adamantyl, and norbornyl groups, preferably a $C_1$ to $C_8$ alkyl group and a $C_3$ to $C_{12}$ monocyclic hydrocarbon group. The acetal group preferably has a structure represented by —O—CH($CH_3$)—O—.

The proportion of introduction of the protective group capable of being cleaved by action of an acid is preferably at least 5 mol %, more preferably at least 10 mol %, and still more preferably at least 20 mol % with respect to the phenolic hydroxyl groups included in the novolak resin from which the resin (A1) is derived. Furthermore, the proportion is preferably 80 mol % or less, and preferably 60 mol % or less with respect to the above-mentioned phenolic hydroxyl groups. There is an optimal protective ratio depending on the protective group. When the resin (A1) has an acetal group, the proportion is preferably at least 30 mol % with respect to the above-mentioned phenolic hydroxyl groups. When the resin has an ethoxyethyl group as the protecting group, the proportion is more preferably 30 to 60 mol % with respect to the above-mentioned phenolic hydroxyl groups. When the resin has propyloxyethyl group as the protecting group, the proportion is more preferably 20 to 60 mol % with respect to the above-mentioned phenolic hydroxyl groups. When the resin has cyclohexyloxyethyl group as the protecting groups, the proportion is more preferably 20 to 60 mol % with respect to the above-mentioned phenolic hydroxyl groups.

The resin (A1) falling within these ranges can easily and effectively provide a resist composition capable of producing resist patterns excellent in a residual film rate, heat resistant properties, and resolution. The proportion of introduction of the protective group capable of being cleaved by action of an acid is calculated from the results obtained by use of a thermogravimetric analysis device (TG-DTA6300; produced by SII) as the reduction in the weight corresponding to the amount of the group having been cleaved by action of an acid. The TG-DTA measurement is preferably performed at a heat increase rate of 10° C./min.

The method of protecting a phenolic hydroxyl group included in a novolak resin by use of a protective group capable of being cleaved by action of an acid includes known methods in this technical field. When protecting by an ethoxyethyl group, the methods include a method which has a step of adding a predetermined amount of ethylvinylether to a novolak resin at room temperature, reacting it for a predetermined time period in the presence of an acid catalyst, and then adding diethylether thereto, followed by washing a reacted mixture with water.

<Resin (A2)>

There is no particular limitation on the resin (A2) that may be contained in the resist composition according to the disclosure, and the resin includes known resins in this technical field. Examples of the resin include a resin having at least one of a structural unit having an acid-labile group (which structural unit is free from a phenylene group constituting a main chain and sometimes referred to as "structural unit (a1)"), a structural unit having no acid-labile group (which is sometimes referred to as "structural unit (s)"), another type of known structural unit in this technical field. The resin (A2) may include a novolak resin without introduction of the protective group, or a resin produced by reacting a resin having at least one selected from a carboxyl group and a phenolic hydroxyl group in its side chain with a compound having at least two vinyloxy groups in one molecule (which is sometimes referred to as "resin (A2b)"). The novolak resin without introduction of a protective group may further has the structural unit (a1), the structural unit (s), or one or more types of other known structural units in this technical field.

Herein, the "acid-labile group" means a group having a leaving group which is detached by contacting with an acid resulting in forming a hydrophilic group such as a hydroxy or carboxy group. Examples of the acid-labile group include a group represented by the formula (1) and the formula (2):

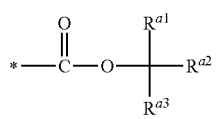

(1)

wherein $R^{a1}$, $R^{a2}$ and $R^{a3}$ each independently represent a $C_1$ to $C_8$ alkyl group, a $C_3$ to $C_{20}$ alicyclic hydrocarbon group or combination thereof, or $R^{a1}$ and $R^{a2}$ may be bonded together with a carbon atom bonded thereto to form a $C_2$ to $C_{20}$ divalent hydrocarbon group and * represents a binding position,

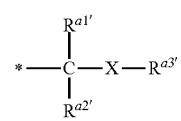

(2)

wherein $Ra^{a1'}$ and $Ra^{a2'}$ each independently represent a hydrogen atom or a $C_1$ to $C_{12}$ hydrocarbon group, $R^{a3'}$ represents a $C_1$ to $C_{20}$ hydrocarbon group, or $R^{a2'}$ and $R^{a3'}$ may be bonded together with a carbon atom and X bonded thereto to form a divalent $C_3$ to $C_{20}$ (or 4 to 21-membered) heterocyclic group, and a methylene group contained in the hydrocarbon group or the divalent heterocyclic group may be replaced by an oxygen atom or a sulfur atom, X represents —O— or —S—; and * represents a binding position.

Examples of the alkyl group include methyl, ethyl, propyl, isopropyl, butyl, pentyl, hexyl, heptyl and octyl groups.

The alicyclic hydrocarbon group may be monocyclic or polycyclic group. Examples of the monocyclic alicyclic hydrocarbon group include a cycloalkyl group such as cyclopentyl, cyclohexyl, cycloheptyl and cyclooctyl groups. Examples of the polycyclic alicyclic hydrocarbon group include decahydronaphthyl, adamantyl, norbornyl, and the following groups;

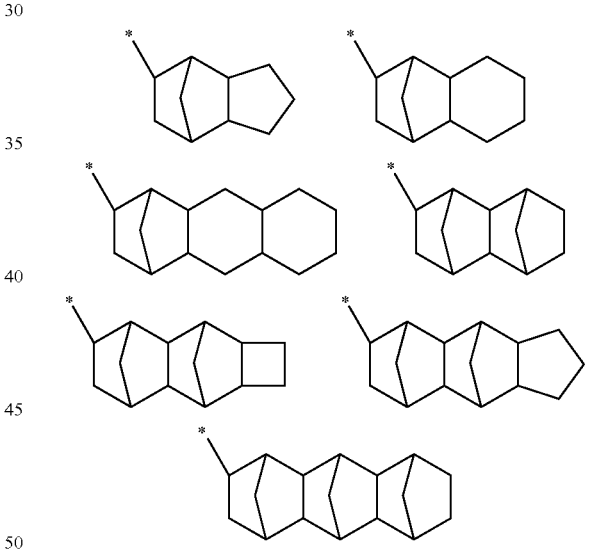

wherein * represents a binding position.

The alicyclic hydrocarbon group preferably has 3 to 16 carbon atoms.

Examples of groups combining the alkyl group and the alicyclic hydrocarbon group include methylcyclohexyl, dimethylcyclohexyl, methylnorbornyl, methyladamantyl, cyclohexylmethyl, methylcyclohexylmethyl, adamantylmethyl and norbornylmethyl groups.

When $R^{a1}$ and $R^{a2}$ is bonded together to form a divalent hydrocarbon group, examples of the group —$C(R^{a1})(R^{a2})$ ($R^{a3}$) include the following groups. The divalent hydrocarbon group is preferably a $C_3$ to $C_{12}$ alicyclic hydrocarbon group. In each of the formulae, * represent a binding position to —O—.

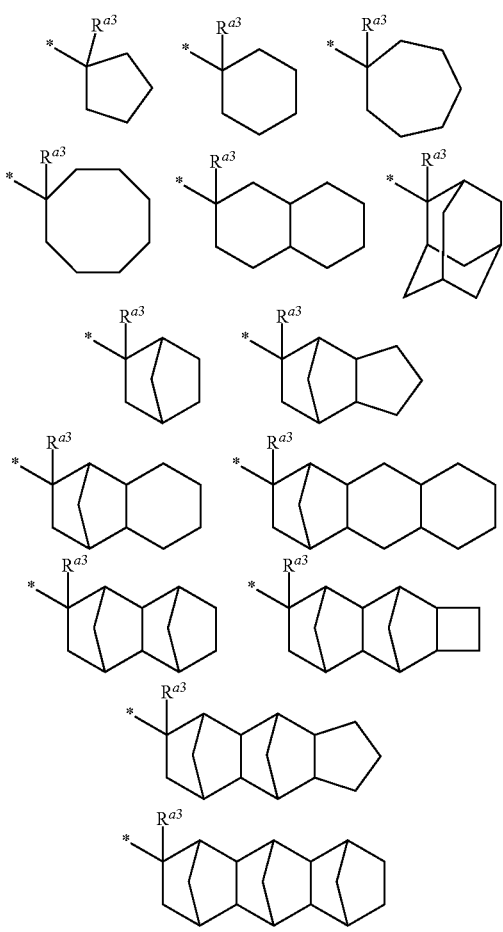

Specific examples of the group represented by the formula (1) include, for example, an alkoxycarbonyl group (a group in which $R^{a1}$ to $R^{a3}$ are alkyl groups, preferably tert-butoxycarbonyl group, in the formula (1)), 1-alkylcyclopentane-1-yloxycarbonyl group and 1-alkylcyclohexane-1-yloxycarbonyl group (a group in which $R^{a1}$ and $R^{a2}$ form a cyclopentyl or a cyclohexyl group, and $R^{a3}$ is an alkyl group, in the formula (1)), and 1-(cyclopentane-1-yl)-1-alkylalkoxycarbonyl group and 1-(cyclohexane-1-yl)-1-alkylalkoxycarbonyl group (a group in which $R^{a1}$ and $R^{a2}$ are an alkyl group, and $R^{a3}$ a cyclopentyl or a cyclohexyl group, in the formula (1)).

The hydrocarbon group for $R^{a1'}$ to $R^{a3'}$ in formula (2) may be any of an alkyl group, an alicyclic hydrocarbon group, an aromatic hydrocarbon group and a group formed by combining thereof.

Examples of the alkyl group include methyl, ethyl, propyl, butyl, pentyl, hexyl, heptyl, octyl, decyl and dodecyl groups.

Examples of the alicyclic hydrocarbon group include a cycloalkyl group such as cyclopentyl, cyclohexyl, cycloheptyl and cyclooctyl groups, and the polycyclic alicyclic hydrocarbon group such as decahydronaphthyl, adamantyl and norbornyl groups.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups. The aromatic hydrocarbon group may have a substituent. Examples of the substituent include a $C_6$ to $C_{10}$ aryloxyl group.

Examples of groups combining the alkyl group and the alicyclic hydrocarbon group include methylcyclohexyl, dimethylcyclohexyl, methylnorbornyl, isobornyl, methyladamantyl, cyclohexylmethyl, methylcyclohexyl methyl, adamantylmethyl and norbornylmethyl groups.

Examples of groups combining the alkyl group and the aromatic hydrocarbon group include aralkyl groups such as benzyl, phenethyl, phenylpropyl, trytil, naphthylmethyl and naphthylethyl groups.

Examples of the divalent heterocyclic group formed by bonding with $R^{a2'}$ and $R^{a3'}$ with a carbon atom and X bonded thereto include the following groups;

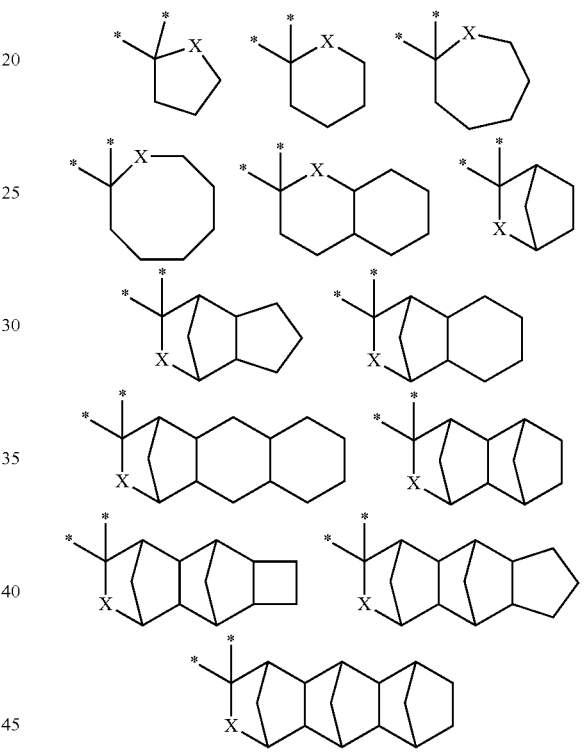

wherein one of * represents a binding position to $R^{a1'}$.

At least one of $R^{a1'}$ and $R^{a2'}$ is preferably a hydrogen atom.

Specific examples of the group represented by the formula (2) include the following groups and those represented by following groups in which an oxygen atom has been replaced by a sulfur atom and/or a sulfur atom has been replaced by an oxygen atom. * represents a binding position.

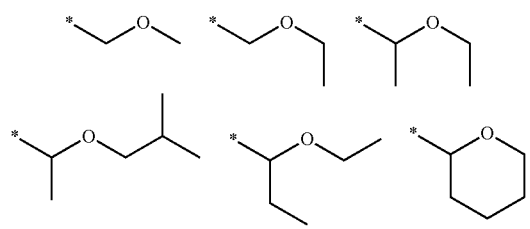

-continued

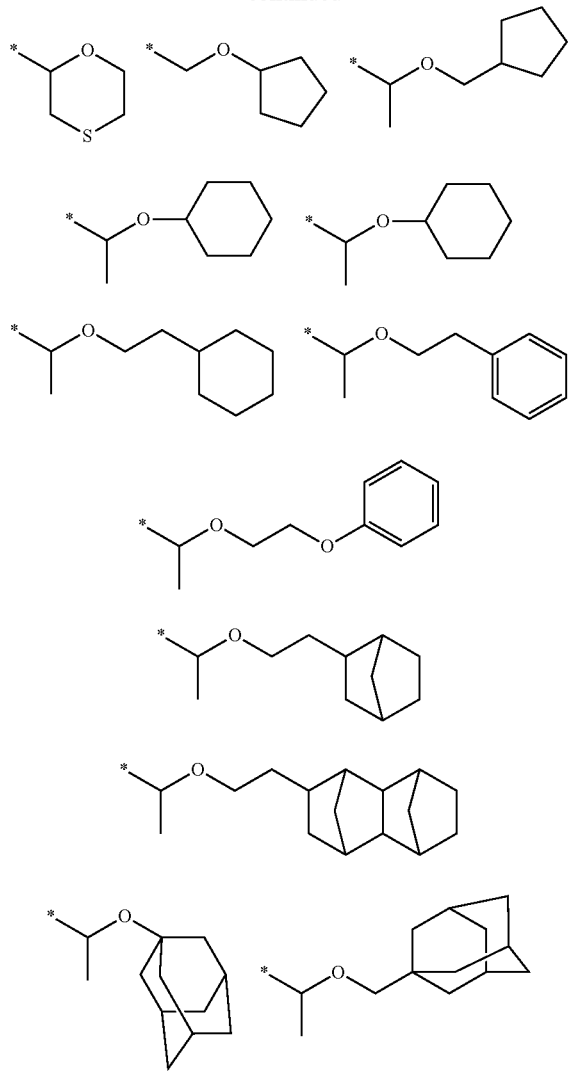

<Structural Unit (a1)>

The monomer which derives the structural unit (a1) is preferably a monomer which has a group having an acid-labile group and an ethylene unsaturated bond, and is more preferably a group represented by the formula (1) or (2) and a ethylene unsaturated bond. These may be used as a single structural unit or as a combination of two or more structural units.

Examples of the structural units (a1) preferably include the structural units represented by formula (a1-1) and formula (a1-2), these are sometimes referred to as the "structural unit (a1-1)" and "structural unit (a1-2)";

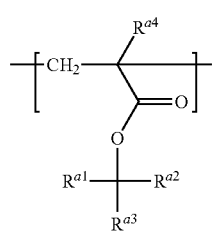

(a1-1)

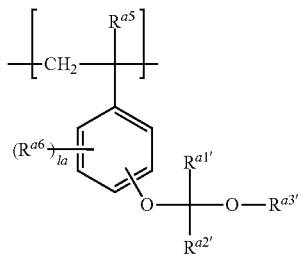

(a1-2)

wherein $R^{a1}$, $R^{a2}$, $R^{a3}$, $R^{a1'}$, $R^{a2'}$ and $R^{a3'}$ are the same meanings as the above, $R^{a4}$ and $R^{a5}$ each independently represent a hydrogen atom or a methyl group, $R^{a6}$ represents a $C_1$ to $C_6$ alkyl group or a $C_1$ to $C_6$ alkoxy group, and "1a" represents an integer of 0 to 4.

Examples of the alkoxy group include methoxy, ethoxy, propoxy, butoxy, pentyloxy and hexyloxy groups.

In the formula (a1-1), $R^{a4}$ is preferably a hydrogen atom.

In the formula (a1-2), $R^{a1'}$ is preferably a hydrogen atom.

$R^{a2'}$ is preferably a $C_1$ to $C_{12}$ hydrocarbon group, and more preferably a methyl group or an ethyl group.

The hydrocarbon group of $R^{a3'}$ is preferably a $C_1$ to $C_{18}$ alkyl group, a $C_3$ to $C_{18}$ alicyclic hydrocarbon group, a $C_6$ to $C_{18}$ aromatic hydrocarbon group or a combination thereof, and more preferably a $C_1$ to $C_{18}$ alkyl group, a $C_3$ to $C_{18}$ alicyclic hydrocarbon group or a $C_7$ to $C_{18}$ aralkyl group. The alkyl group and the alicyclic group is preferably unsubstituted. When the aromatic hydrocarbon group has been substituted, the substituent is preferably a $C_6$ to $C_{10}$ aryloxy group.

Examples of the aryloxy group include phenyloxy, naphthyloxy, p-methylphenyloxy, p-tert-butylphenyloxy, tolyloxy, xylyloxy, 2,6-diethylphenyloxy and 2-methyl-6-ethylphenyloxy groups.

$R^{a5}$ is preferably a hydrogen atom.

$R^{a6}$ is preferably a $C_1$ to $C_4$ alkoxy group, more preferably a methoxy group or an ethoxy group, and still more preferably a methoxy group.

"1a" is preferably 0 or 1, and more preferably 0.

Examples of the structural unit represented by formula (a1-1) include those represented by formulae (a1-1-1) to (a1-1-17).

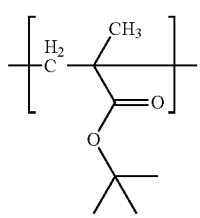

(a1-1-1)

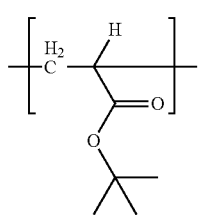

(a1-1-2)

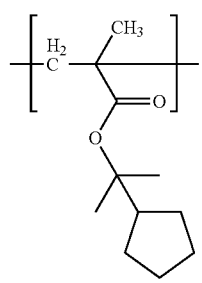
(a1-1-3)
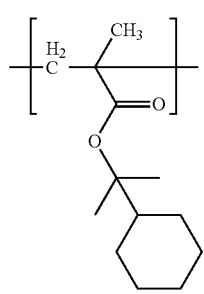
(a1-1-4)
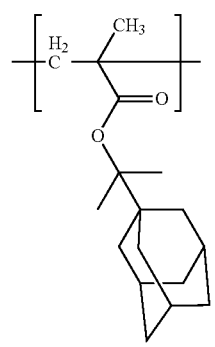
(a1-1-5)
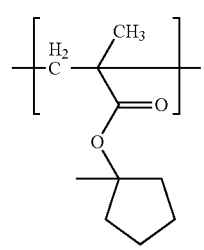
(a1-1-6)
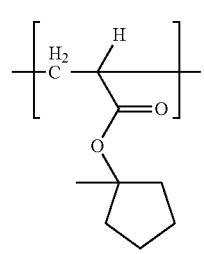
(a1-1-7)
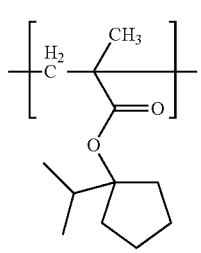
(a1-1-8)
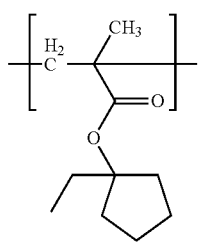
(a1-1-9)
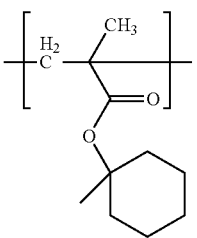
(a1-1-10)
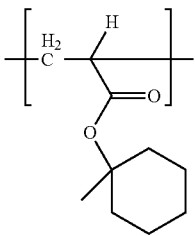
(a1-10-11)
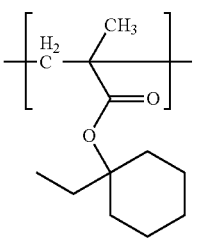
(a1-1-12)
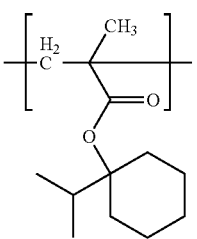
(a1-1-13)

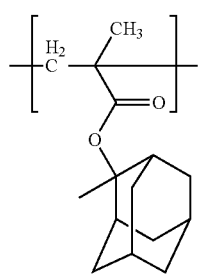 (a1-1-14)
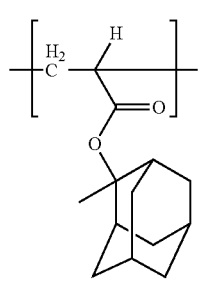 (a1-1-15)
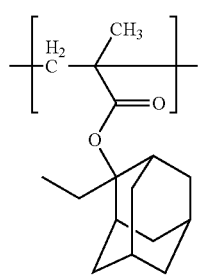 (a1-1-16)
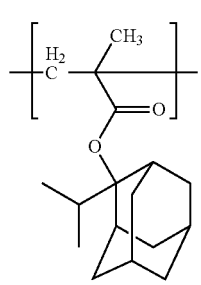 (a1-1-17)
Examples of the structural unit represented by formula (a1-2) include those derived from the monomer represented by formulae (a1-2-1) to (a1-2-14).
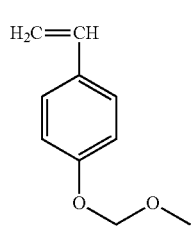 (a1-2-1)
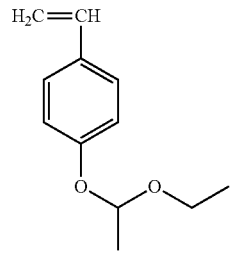 (a1-2-2)
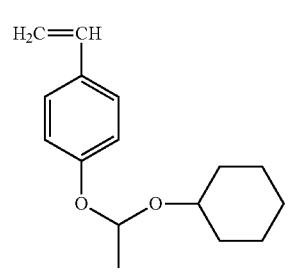 (a1-2-3)
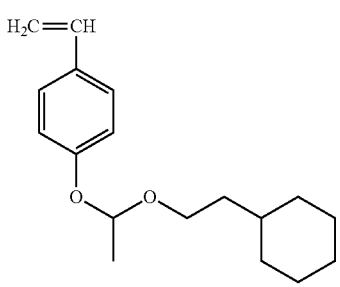 (a1-2-4)
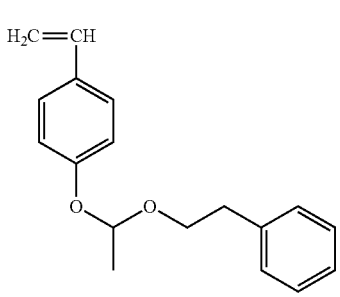 (a1-2-5)
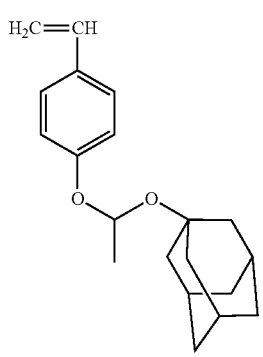 (a1-2-6)

(a1-2-7)
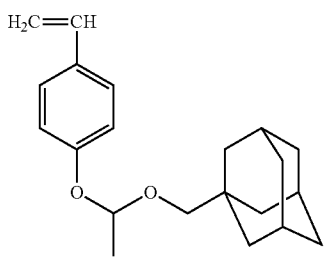

(a1-2-8)
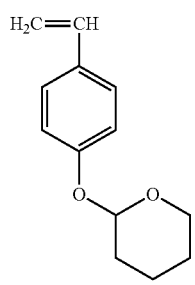

(a1-2-9)
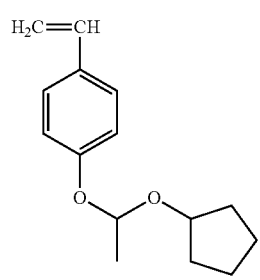

(a1-2-10)
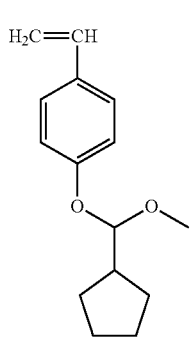

(a1-2-11)
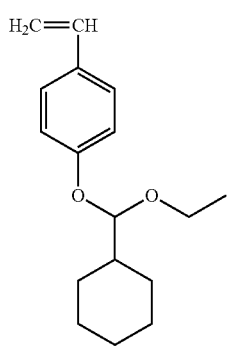

(a1-2-12)
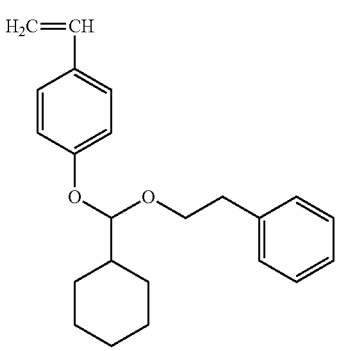

(a1-2-13)
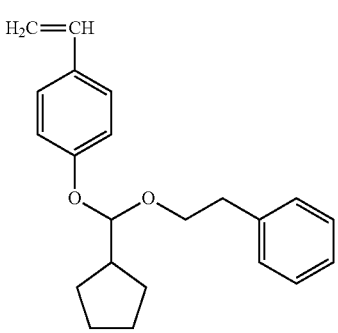

(a1-2-14)
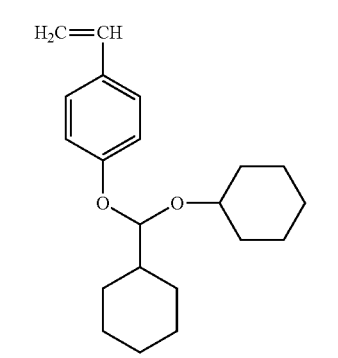

Examples of the monomers include monomers in which a methyl group corresponding to $R^{a4}$ and $R^{a5}$ has been replaced by a hydrogen atom.

Among these, the structural units derived from the monomers represented by formulae (a1-2-2), (a1-2-3), (a1-2-4), (a1-2-9) and (a1-2-14) are preferred, and the structural units derived from the monomers represented by formulae (a1-2-2), (a1-2-3), (a1-2-4) and (a1-2-9) are more preferred.

When resin (A2) has the structural unit represented by formula (a1-1) and/or formula (a1-2), the total structural units is preferably 1 to 50 mole %, more preferably 5 to 45 mole %, still more preferably 5 to 40 mole %, and particularly preferably 5 to 35 mole % with respect to the total structural units (100 mole %) of the resin (A2).

<Structural Unit (s)>

Examples of the structural unit (s) include structural units represented by formulae (a2-1), (a2-2) and (a2-3), these are sometimes referred to as the "structural unit (a2-1)", "structural unit (a2-2)" and "structural unit (a2-3)";

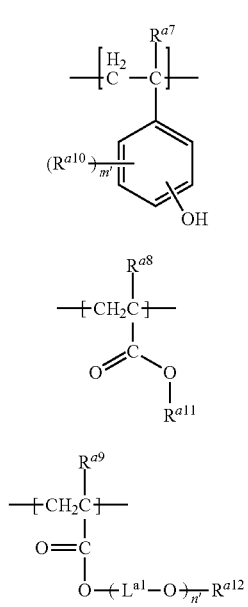

(a2-1)

(a2-2)

(a2-3)

wherein $R^{a7}$, $R^{a8}$ and $R^{a9}$ each independently represent a hydrogen atom or a methyl group, $R^{a10}$ represents a $C_1$ to $C_6$ alkyl group or a $C_1$ to $C_6$ alkoxy group, m' represents an integer of 0 to 4, $R^{a11}$ represents a $C_1$ to $C_{10}$ primary or secondary hydrocarbon group, $R^{a12}$ represents a $C_1$ to $C_6$ primary or secondary alkyl group, $L^{a1}$ represents a $C_2$ to $C_6$ alkanediyl group where the carbon atom bonding to an oxygen atom is a primary or secondary carbon atom, and n' represents an integer of 1 to 30.

These may be used as a single structural unit or as a combination of two or more structural units.

Examples of the alkyl group include methyl, ethyl, propyl, butyl, pentyl and hexyl groups.

Examples of the alkoxy group include methoxy, ethoxy, propoxy, butoxy, pentyloxy and hexyloxy groups.

Examples of the alkanediyl group include linear alkanediyl groups such as ethylene, propane-1,3-diyl, propane-1,2-diyl, butane-1,4-diyl, pentane-1,5-diyl, hexane-1,6-diyl, ethane-1,1-diyl, propane-1,1-diyl and propane-2,2-diyl groups; and branched alkanediyl groups such as propane-1,2-diyl, pentane-2,4-diyl, 2-methylpropane-1,3-diyl, pentane-1,4-diyl and 2-methylbutane-1,4-diyl groups.

The hydrocarbon group for $R^{a11}$ may be an alkyl group, an alicyclic hydrocarbon group, an aromatic hydrocarbon group or a combination thereof.

Examples of the alkyl group include methyl, ethyl, propyl, butyl, pentyl, hexyl, heptyl, octyl, nonyl and decyl groups.

The alicyclic hydrocarbon group may be any of a monocyclic and polycyclic groups.

Examples of the monocyclic alicyclic hydrocarbon group include a cycloalkyl group such as cyclopentyl, cyclohexyl, cycloheptyl and cyclooctyl groups.

Examples of the polycyclic alicyclic hydrocarbon group include a decahydronaphtyl, adamantyl and norbornyl groups as well as the following groups. In each of the formulae, * represents a binding position.

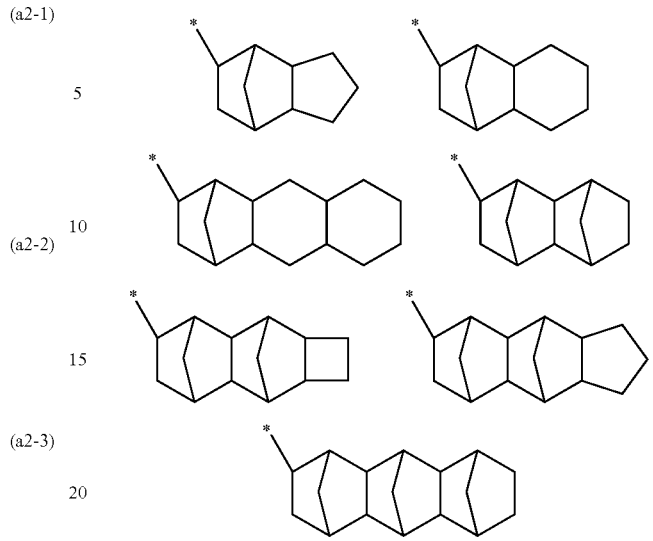

Examples of groups combining the alkyl group and the alicyclic hydrocarbon group include methylcyclohexyl, dimethylcyclohexyl, methylnorbornyl, cyclohexylmethyl, adamantylmethyl and norbornyletyl groups.

Examples of the aromatic hydrocarbon group include phenyl, naphthyl, aralkyl and benzyl groups.

$R^{a7}$ preferably represents a hydrogen atom.

$R^{a8}$ and $R^{a9}$ are preferably a methyl group.

$R^{a10}$ is preferably a $C_1$ to $C_4$ alkoxy group, more preferably a methoxy group or an ethoxy group, and still more preferably a methoxy group.

m' represents preferably 0 or 1, more preferably 0.

$R^{a11}$ represents preferably a $C_1$ to $C_6$ primary or secondary alkyl group.

$L^{a1}$ represents preferably a $C_2$ to $C_4$ alkanediyl group such as ethane-1,2-diyl, propane-1,3-diyl, propane-1,2-diyl and butane-1,4-diyl groups, more preferably an ethane-1,2-diyl group, and still more preferably an alkanediyl group having two or more carbon atoms between two oxygen atoms.

n' represents preferably an integer of 1 to 10.

$R^{a12}$ represents preferably a $C_1$ to $C_3$ primary or secondary alkyl group.

Examples of the structural unit represented by formula (a2-1) preferably include those represented by formulae (a2-1-1), (a2-1-2), (a2-1-3) and (a2-1-4). The monomer which derives the structural unit (a1) is preferably monomers described in JP2010-204634A1.

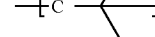

(a2-1-1)

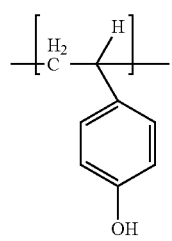
(a2-1-2)

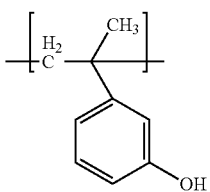
(a2-1-3)

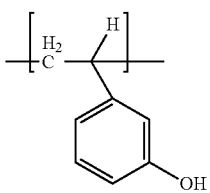
(a2-1-4)

Examples of the monomers which derive the structural units represented by formula (a2-2) include alkyl(meth)acrylates such as methyl(meth)acrylate, ethyl(meth)acrylate, propyl(meth)acrylate, butyl(meth)acrylate and hexyl(meth)acrylate;

cycloalkyl(meth)acrylates such as cyclopentyl(meth)acrylate and cyclohexyl(meth)acrylate;

polycyclic(meth)acrylates such as adamantyl(meth)acrylate, and aryl(meth)acrylates such as phenyl(meth)acrylate and benzyl(meth)acrylate.

Examples of the monomers which derives the structural units represented by formula (a2-3) include (meth)acrylates such as ethylene glycol monomethyl ether(meth)acrylate, ethylene glycol monoethyl ether(meth)acrylate, ethylene glycol monopropyl ether(meth)acrylate, ethylene glycol monobutyl ether(meth)acrylate, diethylene glycol monomethyl ether(meth)acrylate, triethylene glycol monomethyl ether(meth)acrylate, tetraethylene glycol monomethyl ether (meth)acrylate, pentaethylene glycol monomethyl ether (meth)acrylate, hexaethylene glycol monomethyl ether (meth)acrylate, nonaethylene glycol monomethyl ether (meth)acrylate, and octaethylene glycol monomethyl ether (meth)acrylate.

Examples of the structural unit (s) include a structural unit represented by formula (a2-4). The structural unit is sometimes referred to as "structural unit (a2-4)".

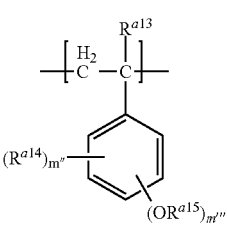
(a2-4)

In the formula, $R^{a13}$ represents a hydrogen atom or a methyl group, $R^{a14}$ in each occurrence independently represent a $C_1$ to $C_6$ alkyl group or a $C_1$ to $C_6$ alkoxy group, $R^{a15}$ in each occurrence independently represent a primary or a secondary $C_1$ to $C_{12}$ hydrocarbon group where a methylene group may be replaced by an oxygen atom or a carbonyl group, provided that the methylene group bonding to an oxygen atom may not be replaced by an oxygen, m" represents an integer of 0 to 4, and m'" represents an integer of 0 to 4, provided that the total number of m" and m'" is 5 or less.

The hydrocarbon group for $R^{a15}$ is a group in which the carbon atom bonding to an oxygen atom is not a tertiary carbon atom, that is, the carbon atom bonding to an oxygen atom has at least one atom other than the carbon atom such as a hydrogen atom.

The structural unit represented by formula (a2-4) does not include the structural unit (I) and the structural unit (a1-2).

Examples of the alkyl group and the alkoxy group for $R^{a14}$ are the same examples as the group described in $R^{a10}$.

Examples of the hydrocarbon group for $R^{a15}$ are the same examples as the group described in $R^{a11}$.

Among them, $R^{a15}$ is preferably a $C_1$ to $C_5$ liner or branched alkyl group, a $C_5$ to $C_{10}$ alicyclic hydrocarbon group and phenyl groups as well as a combination thereof, or these groups where a carbon atom bonding to an oxygen atom in these groups may be replaced by a carbonyl group.

Examples of the structural unit (a2-4) include the following ones.

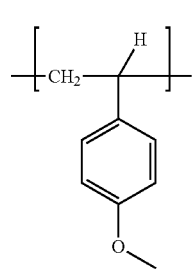
(a2-4-1)

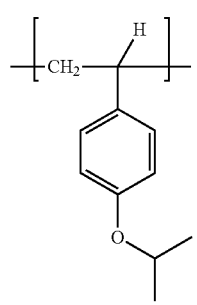
(a2-4-2)

(a2-4-3)
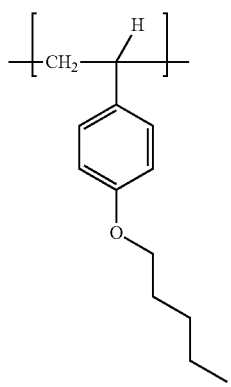

(a2-4-4)
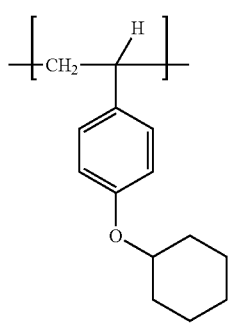

(a2-4-5)
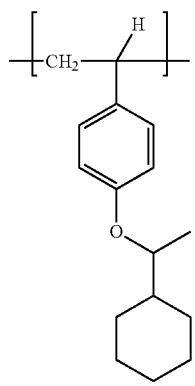

(a2-4-6)
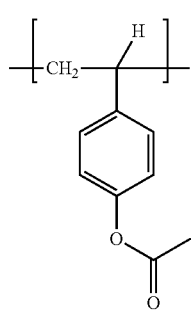

(a2-4-7)
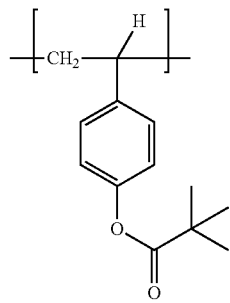

(a2-4-8)
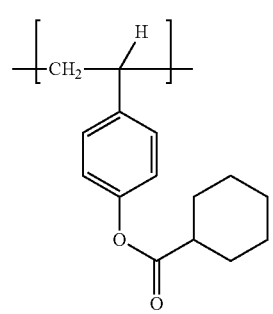

(a2-4-9)
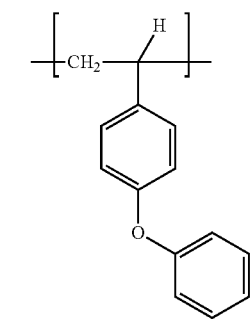

(a2-4-10)

Examples of the structural unit (a2-4) include the structural units represented by the above formulae in which a hydrogen atom corresponding to $R^{a13}$ has been replaced by a methyl group.

Examples of the monomer which derives the structural unit (s) include acrylic acid, methacrylic acid, crotonic acid, 2-hydroxyethyl(meth)acrylate, 2-hydroxypropyl(meth)acrylate, styrene, α-methylstyrene, 4-methylstyrene, 2-methylstyrene, 3-methylstyrene, 4-methoxy styrene, 4-isopropoxystyrene.

When the resin (A2) has the structural unit (s), the mole ratio of the structural unit (a1): the structural unit (s) is preferably 10:90 to 80:20, more preferably 15:85 to 45:55, and still more preferably 20:80 to 60:40.

Examples of combinations of the structural units in the resin (A2) include the following ones.

(A1-1)
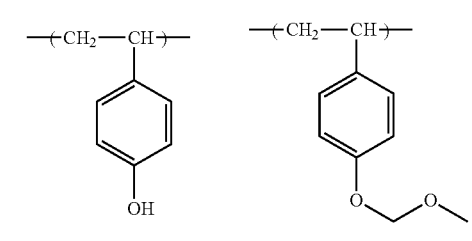
(A1-2)
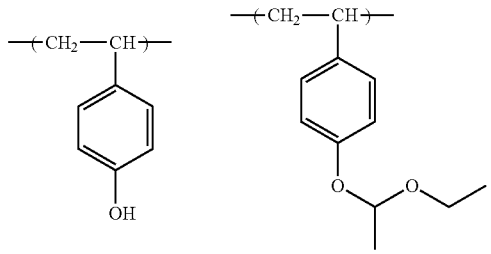
(A1-3)
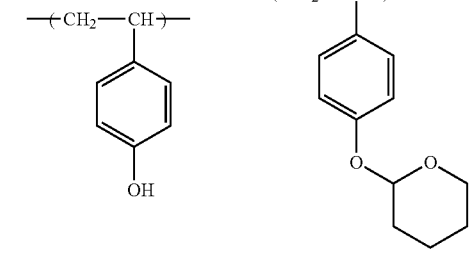
(A1-4)
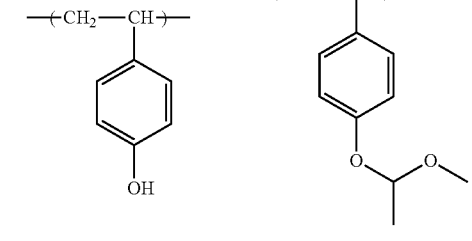
(A1-5)
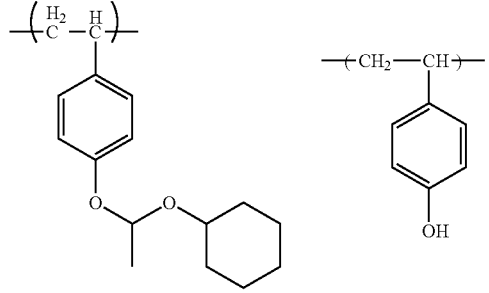
(A1-6)
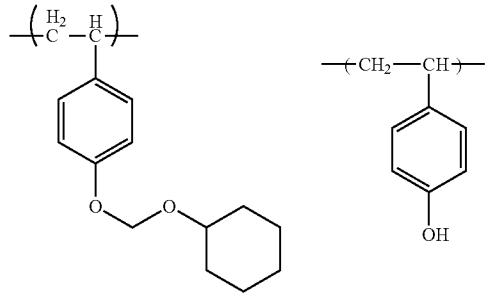
(A1-7)
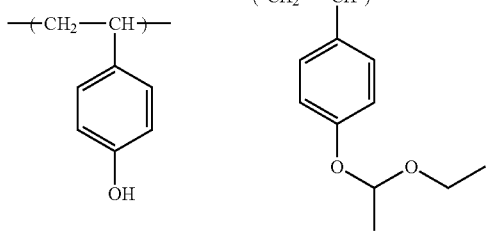
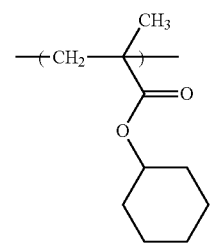
(A1-8)
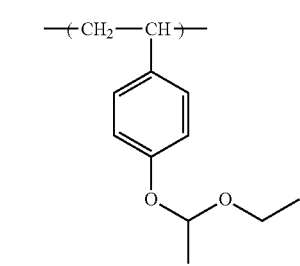
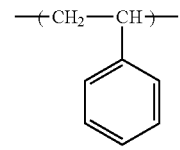
(A1-9)
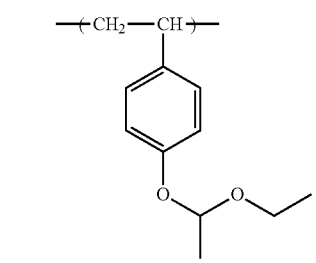
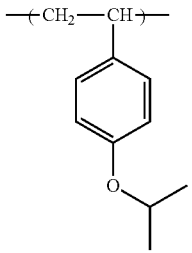

(A1-10) 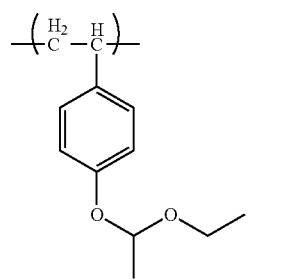 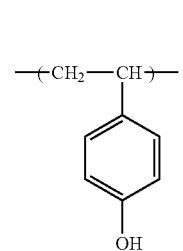 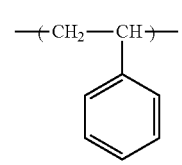
(A1-13) 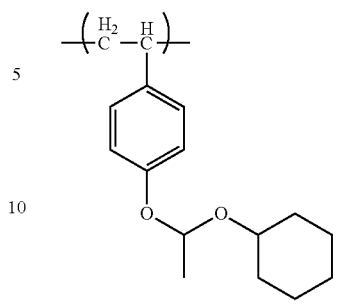 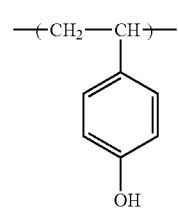
(A1-11) 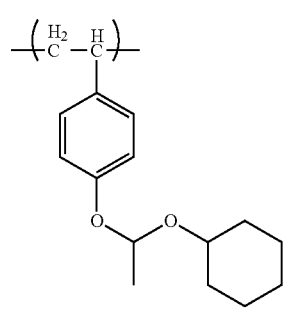 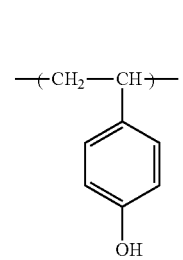
(A1-14) 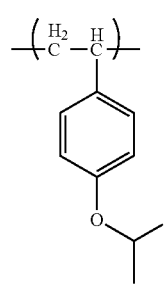 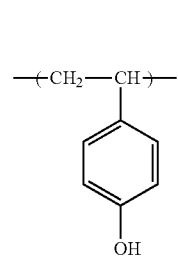 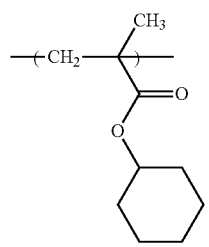
(A1-12) 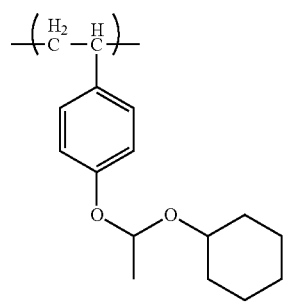 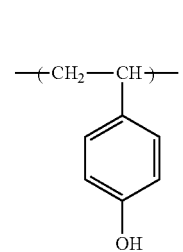 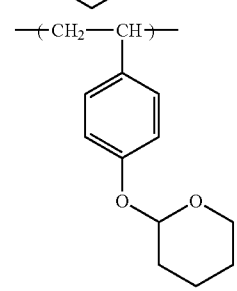
(A1-15) 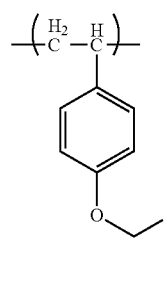 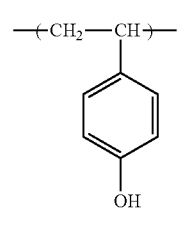 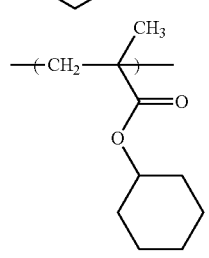

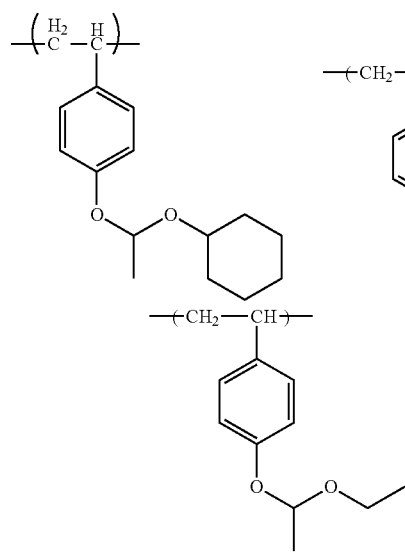
(A1-16)
(A1-17)
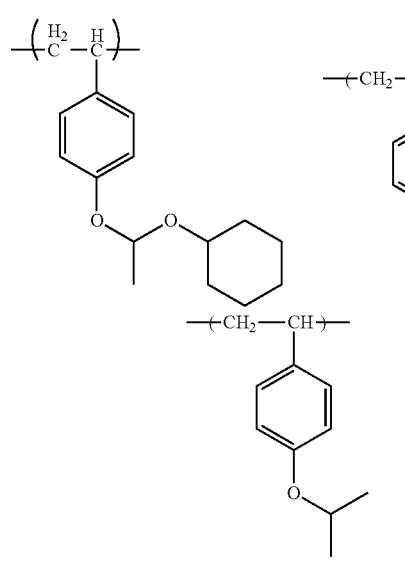
(A1-18)
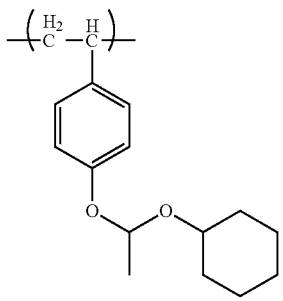 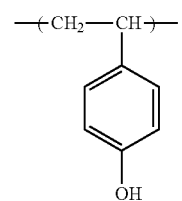
(A1-19)
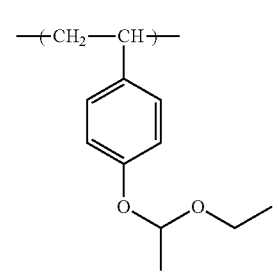 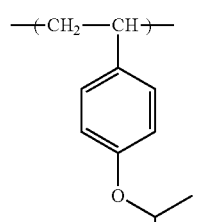
(A1-20)
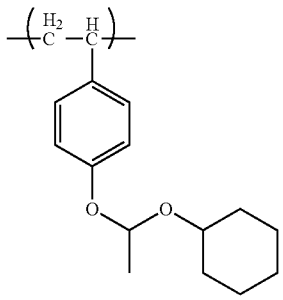 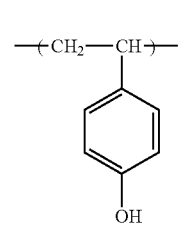
(A1-21)
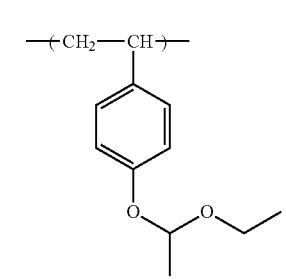 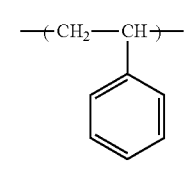

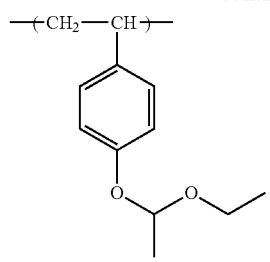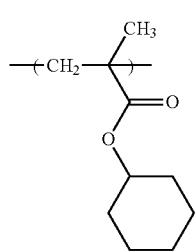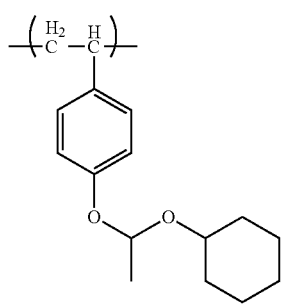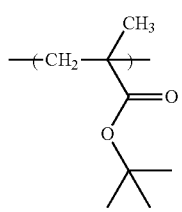
(A1-22)
(A1-24)
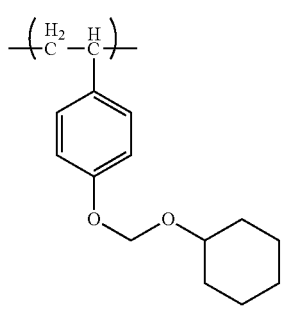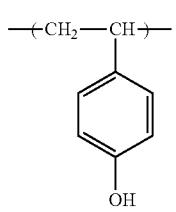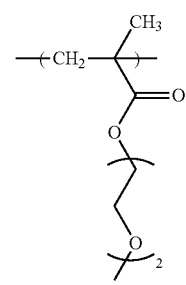
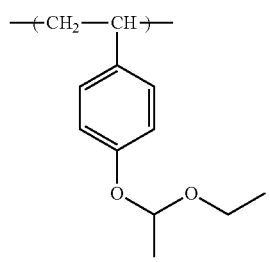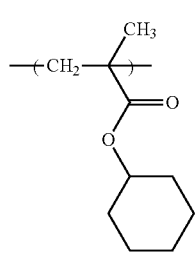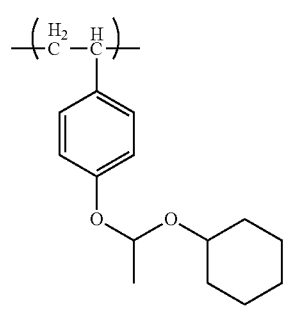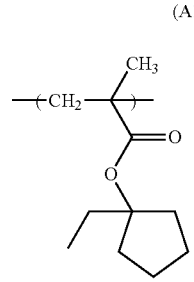
(A1-25)
(A1-23)
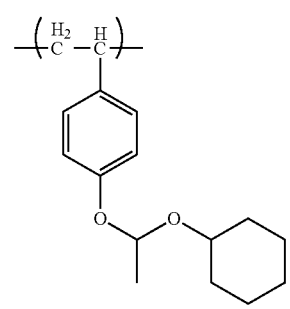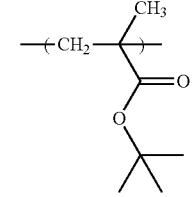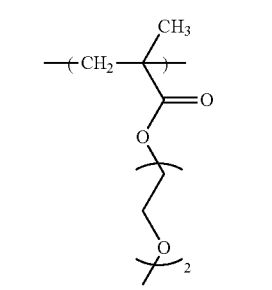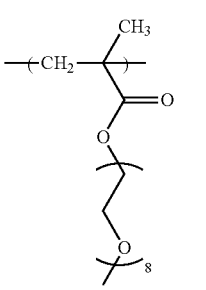
(A1-26)
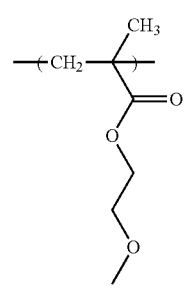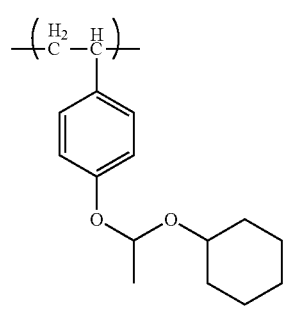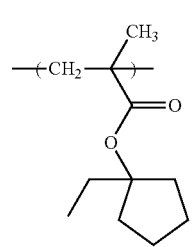

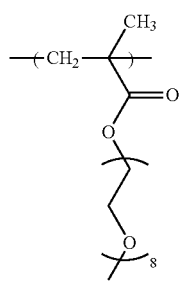 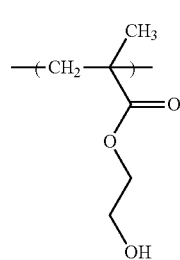
(A1-27)
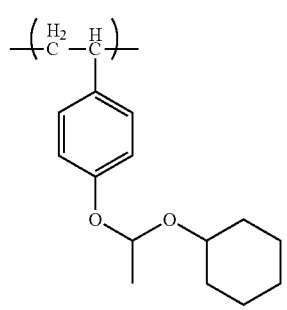 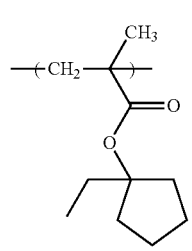
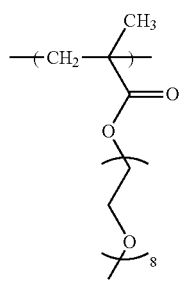 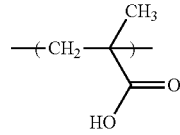
(A1-28)
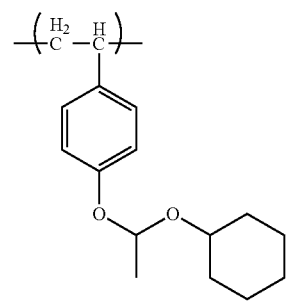 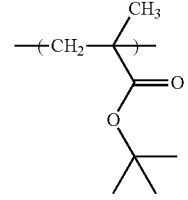
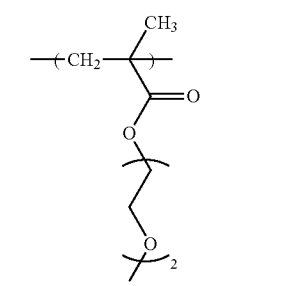 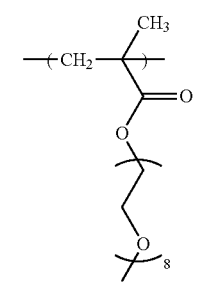 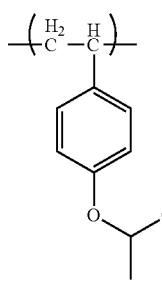
(A1-29)
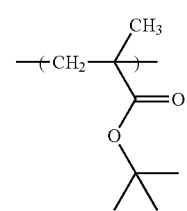 
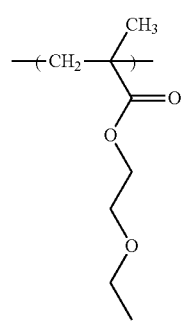
(A1-30)
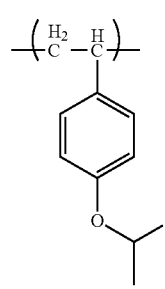 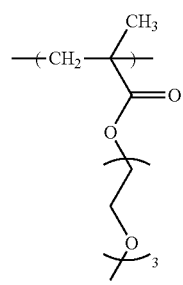
(A1-31)
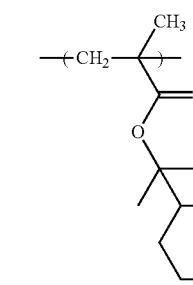

(A1-32)
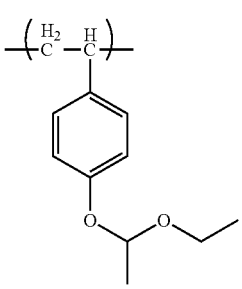
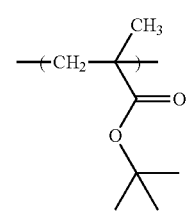
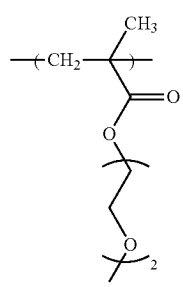
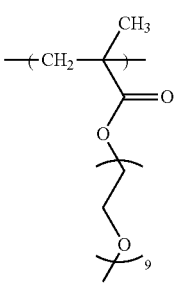
(A1-33)
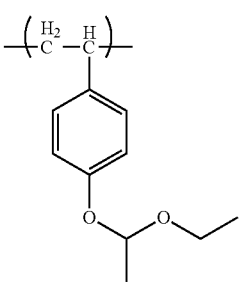
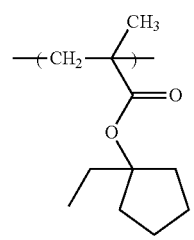
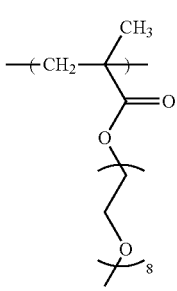
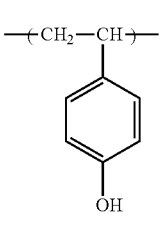
(A1-34)
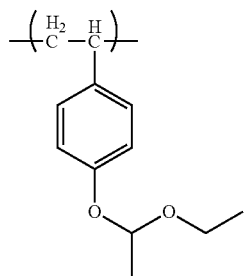
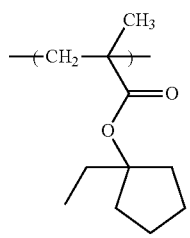
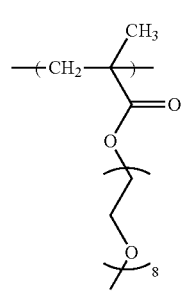
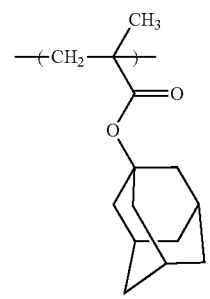
(A1-35)
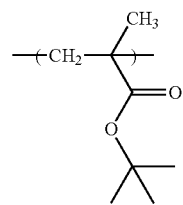
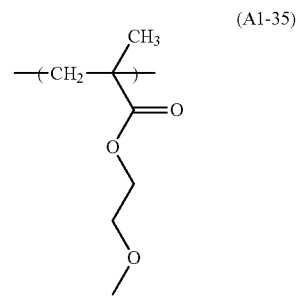
(A1-36)
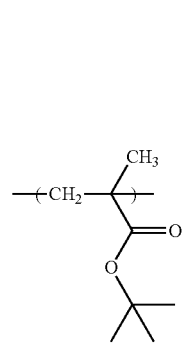
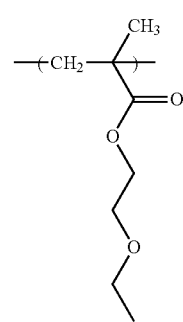
(A1-37)
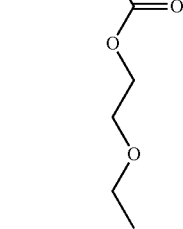
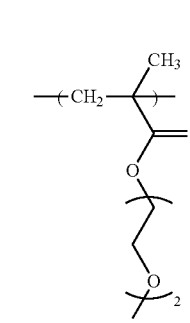

(A1-38) 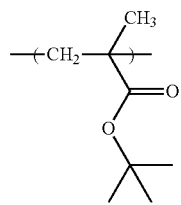 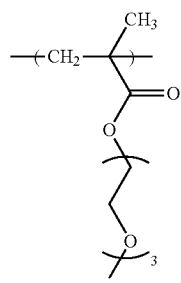
(A1-39) 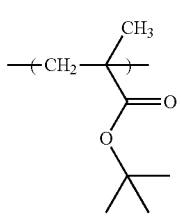 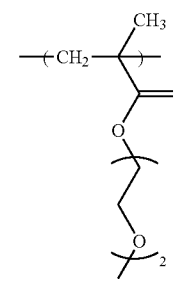 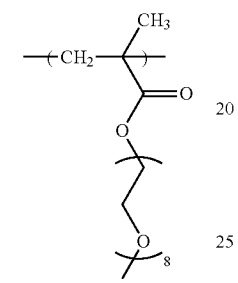
(A1-40) 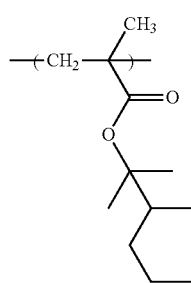 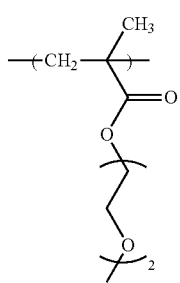
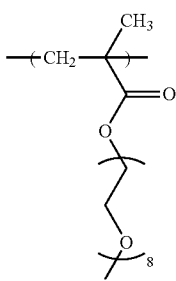
(A1-41) 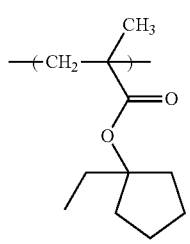 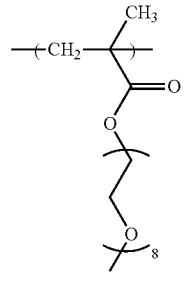 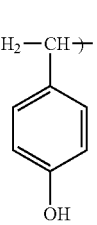
(A1-42) 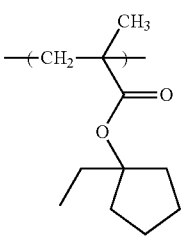 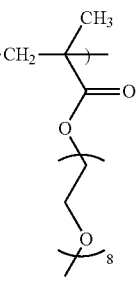
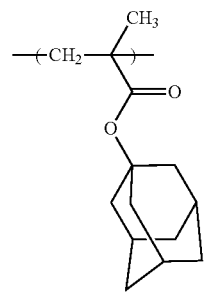
(A1-43) 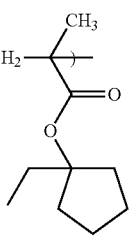 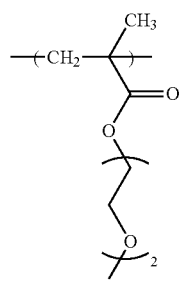
(A1-44) 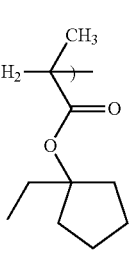 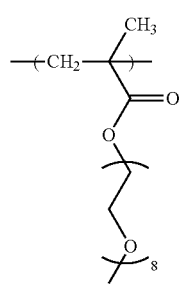
(A1-45) 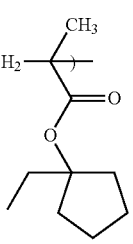 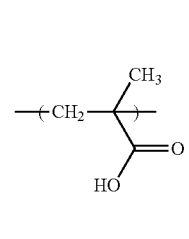

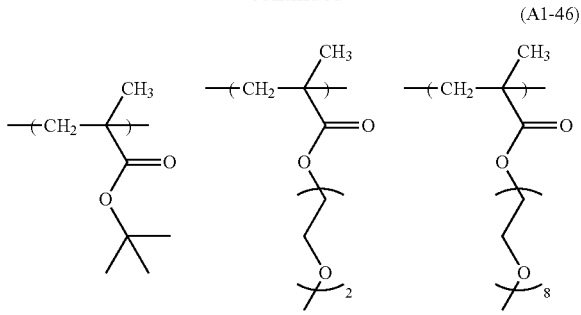

(A1-46)

Examples of the structural units include structural units in which a hydrogen atom corresponding to $R^{a5}$ or the like has been replaced by a methyl group, or a methyl group corresponding to $R^{a5}$ or the like has been replaced by a hydrogen atom. The resin may have a mixture of a monomer having a hydrogen atom and a monomer having a methyl group.

The resin (A2b) is preferably a resin obtained by reacting a resin which has a phenolic hydroxyl group with a compound which has at least two vinyloxy groups. The resin (A2b) can be produced by reacting a resin which has the structural unit (a1-2) with the compound which has at least two vinyloxy groups. The resin having a phenolic hydroxyl group can be used the above described novolak resin, and the resin (A2b) may be produced by reacting the above described novolak resin with the compound which has at least two vinyloxy groups. The resin (A2b) may be a resin obtained by reacting the compound which has at least two vinyloxy groups with a combination of a novolak resin and a resin having the structural unit (a1-2). Further, the resin (a2b) may be a combination of a resin which is obtained by reacting a resin having the structural unit (a1-2) with the above described the compound having at least two vinyloxy groups, and a resin which is obtained by reacting the novolak resin with the above described the compound having at least two vinyloxy groups.

Examples of the compound having at least two vinyloxy groups include 1,4-cyclohexanedimethanoldivinylether and ethyleneglycoldivinylether.

In the production of the resin (A2b), the mass ratio of the resin having a phenolic hydroxyl group: the compound having at least two vinyloxy groups may be 30 to 70:70 to 30. The mass ratio of the resin having the structural unit (a1-2): the novolak resin: the compound having at least two vinyloxy groups may be 0 to 99.7:99.7 to 0:0.3 to 5.

The average weight molecule weight of the resin (A2b) is preferably 5,000 or more, more preferably 10,000 or more, and preferably 300,000 or less, more preferably 200,000 or less.

Specific examples of the resin (A2b) include the resins described in JP2008-134515A1 and JP 2008-46594A1.

The resin (A2) is preferably a resin having the structural unit (a1) and the structural unit (s), more preferably the structural unit (a1-1) and/or the structural unit (a1-2) as well as the structural unit (s).

The resin (A2) can be produced by polymerizing the above-mentioned monomers in a known manner such as radical polymerization.

The average weight molecule weight of the resin (A2) is preferably 5,000 or more, more preferably 8,000 or more, still more preferably 10,000 or more, and preferably 600,000 or less, more preferably 500,000 or less.

When the resist composition of the disclosure contains the resin (A1) and the resin (A2), the content thereof may be 100 to 5:0 to 95, preferably 90 to 10:10 to 90, and more preferably 80 to 15:20 to 85 base on mass.

The total content of the resin (A1) and/or the resin (A2) in the resist composition is preferably 80% by mass to 99% by mass, more preferably 90% by mass to 99% by mass with respect to the total amount of solid components of the resist composition.

The content of the solid components in the resist composition and that of the resins in the solid components can be measured with a known analytical method such as liquid chromatography and gas chromatography.

<Acid Generator (B)>

The resist composition of the disclosure contains an acid generator (B).

The acid generator is a compound which can be decomposed by light to generate an acid. The acid acts catalytically to the resin (A) and eliminate a leaving group which is detached by contacting with an acid. The acid generators may be either ionic or non-ionic one.

Examples of the non-ionic acid generator include organic halide, sulfonate esters (e.g., 2-nitrobenzoate, aromatic sulfonate, oxime sulfonate, N-sulfonyloxyimide, sulfonyl oxyketone, diazonaphthoquinone 4-sulfonate) and sulfone (e.g., disulfone, ketosulfone, sulfonyldiazomethane). Examples of the ionic acid generator includes an onium salt comprising an onium cation (e.g., adiazonium salt, a phosphonium salt, a sulfonium salt, an iodonium salt). Examples of an anions of the onium salts include a sulfonic acid anion, a sulfonylimide anion and a sulfonylmethide anion.

The acid generator includes compounds which generate an acid upon radiation, which are described in JP63-26653A1, JP 55-164824A1, JP62-69263A1, JP63-146038A1, JP63-163452A1, JP 62-153853A1, JP63-146029A1, U.S. Pat. Nos. 3,779,778, 3,849,137, German patent No. 3914407 and European patent No. 126712. The acid generator is available on the market, or it can be prepared by a known method.

The non-ionic acid generator is preferably a compound which has a group represented by formula (B1):

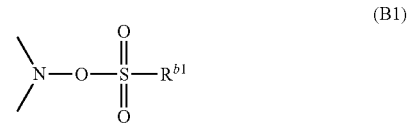

(B1)

wherein $R^{b1}$ represents a $C_1$ to $C_{18}$ hydrocarbon group in which a hydrogen atom can be replaced by a fluorine atom and in which a methylene group may be replaced by an oxygen atom or a carbonyl group.

The nitrogen atom in formula (B1) may have a double bond, although it is not illustrated therein.

The $C_1$ to $C_{18}$ hydrocarbon group may be an aliphatic hydrocarbon group, an alicyclic hydrocarbon group, an aromatic hydrocarbon group and a combination thereof.

Examples of the aliphatic hydrocarbon group include an alkyl groups such as methyl, ethyl, propyl, butyl, pentyl, hexyl, heptyl octyl, nonyl and decyl groups.

Examples of the alicyclic hydrocarbon group include cyclopropyl, cyclobutyl, cyclopentyl, cyclohexyl, cycloheptyl, cyclooctyl and adamantyl groups.

Examples of the aromatic hydrocarbon group include a $C_6$ to $C_{18}$ aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl, 2-methyl-6-ethylphenyl.

The hydrocarbon group is preferably a $C_1$ to $C_{10}$ alkyl group or a $C_6$ to $C_{10}$ aromatic hydrocarbon group, and more preferably a $C_1$ to $C_8$ alkyl group, and still more preferably a $C_1$ to $C_4$ alkyl group.

Examples of the hydrocarbon group in which a methylene group has been replaced by an oxygen atom or a carbonyl group includes those represented by formulae (Y1) to (Y12), preferably those represented by formulae (Y7) to (Y9), more preferably one represented by formula (Y9):

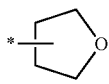
(Y1)

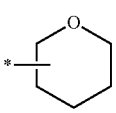
(Y2)

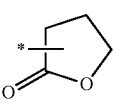
(Y3)

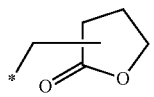
(Y4)

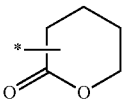
(Y5)

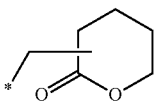
(Y6)

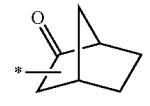
(Y7)

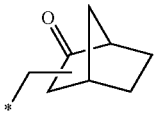
(Y8)

(Y9)

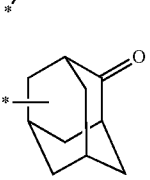
(Y10)

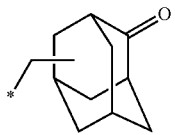
(Y11)

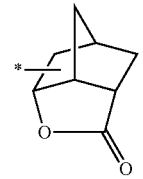
(Y12)

wherein "*" represents a binding position.

Examples of the hydrocarbon group which has a fluorine atom include fluoroalkyl groups such as fluoromethyl, fluoroethyl, fluoropropyl, fluorobutyl, fluoropentyl, fluorohexyl, fluoroheptyl, fluorooctyl, fluorononyl and fluorodecyl groups; alicyclic fluorohydrocarbon groups such as cyclofluoropropyl, cyclofluorobutyl, cyclofluoropentyl, cyclofluorohexyl, cyclofluoroheptyl, cycloperfluorooctyl and fluoroadamantyl groups; fluoroaryl groups such as fluorophenyl, fluoronaphthyl and fluoroanthrylmethyl groups.

The hydrocarbon group which has a fluorine atom is preferably a $C_1$ to $C_{10}$ alkyl group which has a fluorine atom and a $C_6$ to $C_{10}$ aromatic hydrocarbon group which has a fluorine atom, and more preferably a $C_1$ to $C_8$ perfluoroalkyl group, and still more preferably a $C_1$ to $C_4$ perfluoroalkyl group.

The compound represented by formula (B1) includes the compounds represented by formulae (b1), (b2) and (b3), preferably the compounds represented by formulae (b1) and (b2), more preferably the compounds represented by formula (b1).

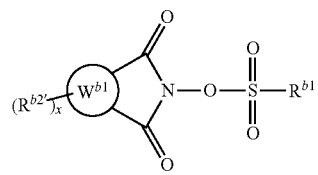
(b1)

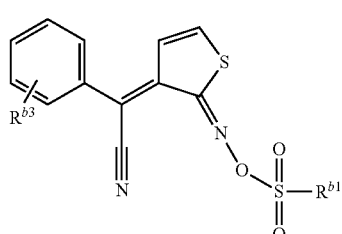
(b2)

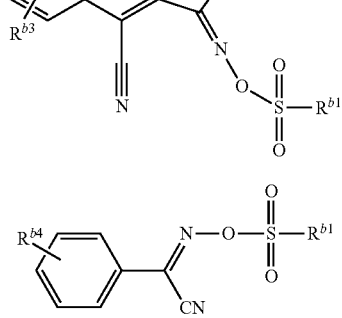
(b3)

In the formulae, $R^{b1}$ is the same meanings as the above, $R^{b2}$, $R^{b3}$ and $R^{b4}$ each independently represent a hydrogen atom, a $C_1$ to $C_8$ alkyl group or a $C_1$ to $C_8$ alkoxy group, and ring $W^{b1}$ represents an optionally substituted $C_6$ to $C_{14}$ aromatic hydrocarbon ring or an optionally substituted $C_6$ to $C_{14}$ aromatic heterocyclic group; and "x" represents an integer of 0 to 2.

Examples of the alkyl group include methyl, ethyl, propyl, butyl and pentyl groups, preferably a methyl group.

Examples of the alkoxy group include methoxy, ethoxy, propoxy, butoxy, and pentyloxy groups, preferably a methoxy group.

Examples of the aromatic hydrocarbon ring include benzene, naphthalene and anthracene rings.

Examples of the aromatic heterocyclic group include a six-membered to fourteen-membered ring, which preferably includes the following ones:

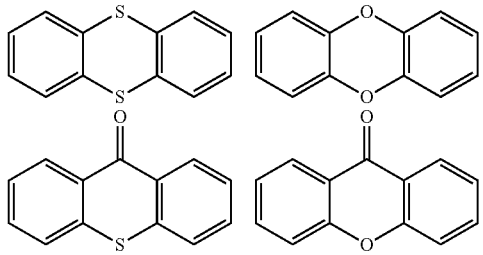

The substituent which the ring $W^{b1}$ optionally has includes a $C_1$ to $C_5$ alkyl group.

The ring $W^{b1}$ is preferably a naphthalene ring.

The compound represented by formula (b1) is preferably a compound represented by any one of formulae (b4) to (b7), more preferably a compound represented by formula (b4).

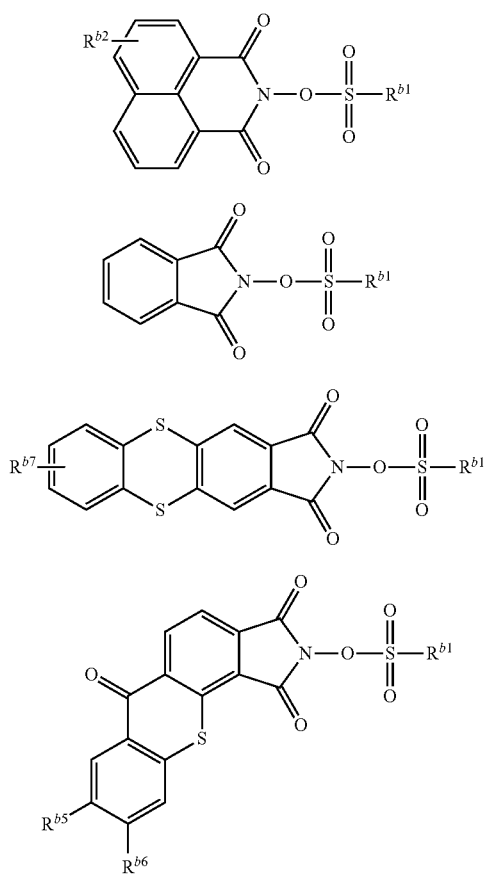

In the formulae, $R^{b1}$ is the same meanings as the above, $R^{b2}$, $R^{b5}$, $R^{b6}$ and $R^{b7}$ each independently represent a hydrogen atom, or a $C_1$ to $C_8$ alkyl group.

Examples of the compound represented by formula (b1) include preferably those represented by formulae (b1-1) to (b1-14), more preferably those represented by formulae (b1-6) and (b1-7).

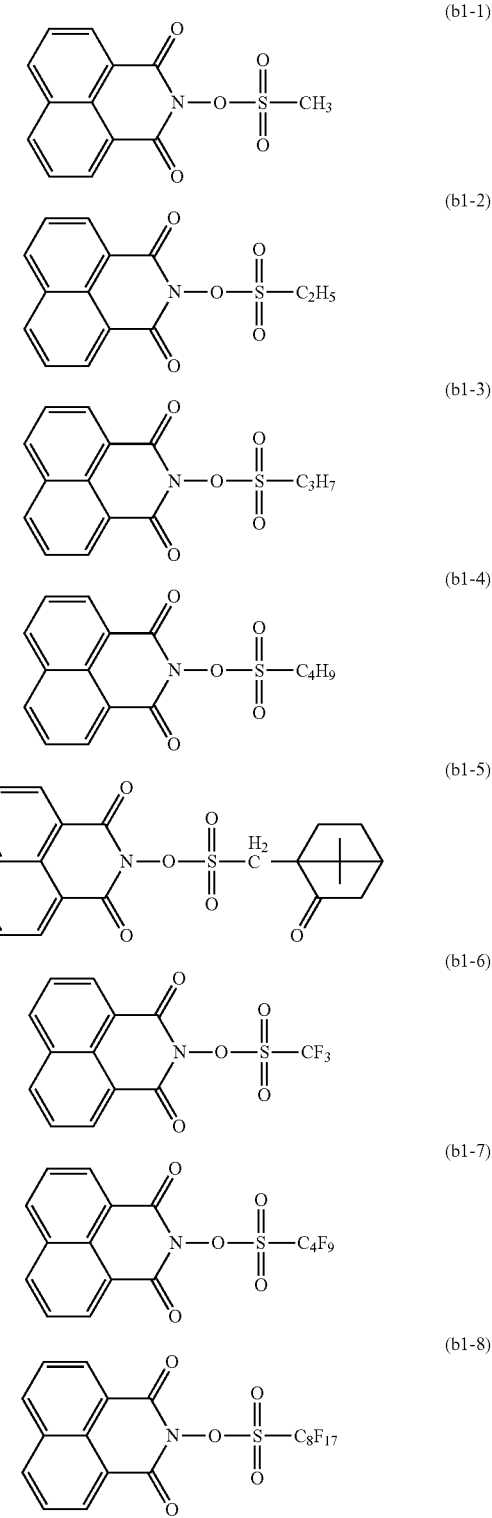

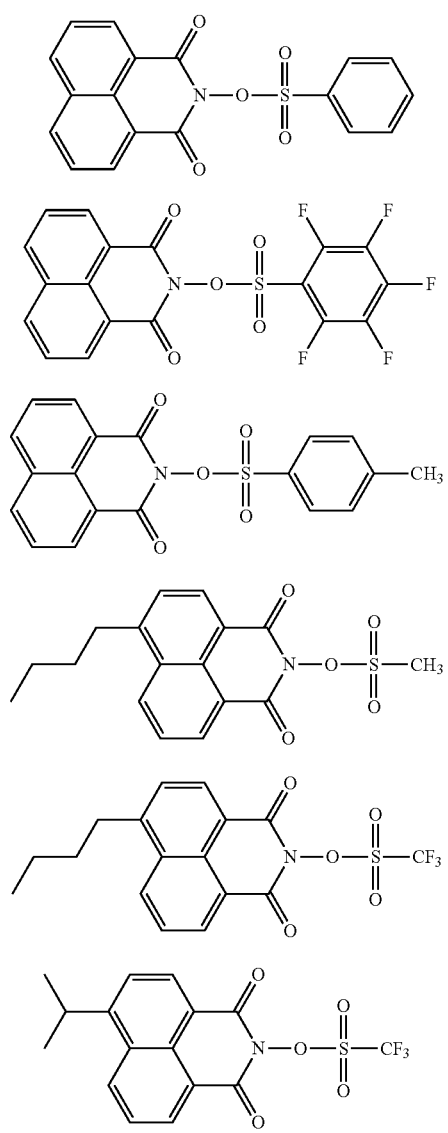
Examples of the compound represented by formula (b2) include the following ones.
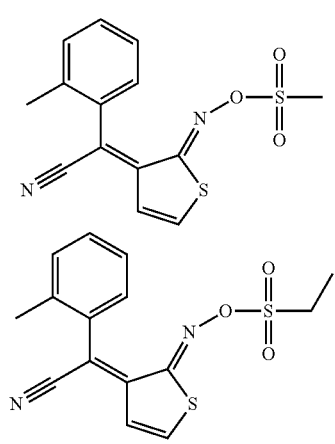
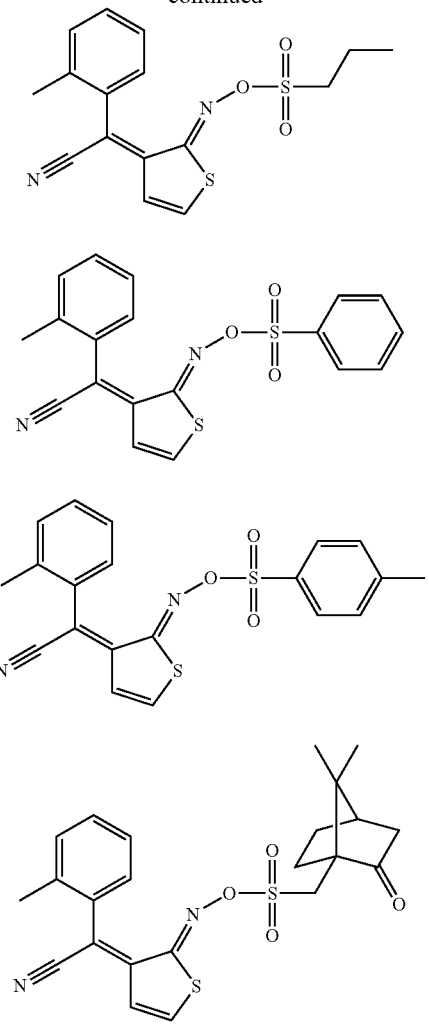
Examples of the compound represented by formula (b3) include the following ones.
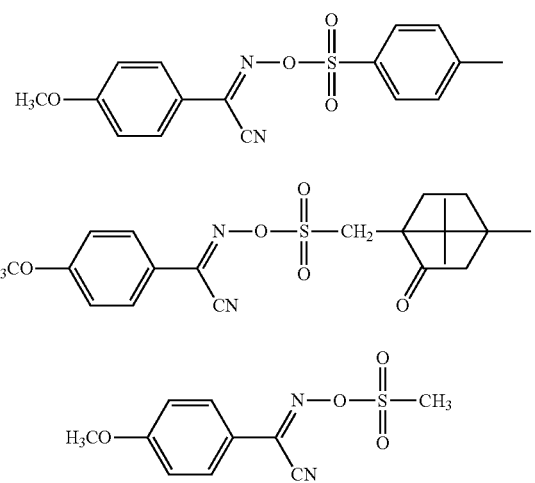
The ionic acid generator is preferably a compound represented by formula (b8) or (b9):

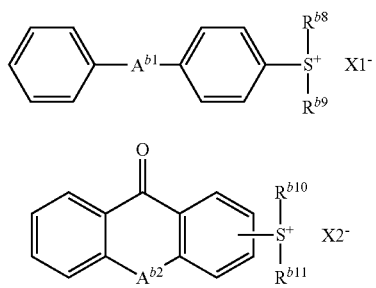

(b8)

(b9)

wherein $A^{b1}$ and $A^{b2}$ each independently represent an oxygen atom or a sulfur atom, $R^{b8}$, $R^{b9}$, $R^{b10}$ and $R^{b11}$ each independently represent a $C_1$ to $C_{10}$ alkyl group or a $C_6$ to $C_{12}$ aromatic hydrocarbon group, and $X1^-$ and $X2^-$ each independently represent an organic anion.

Examples of the alkyl group include methyl, ethyl, propyl, butyl, pentyl, hexyl, heptyl group and octyl groups.

Examples of the aromatic hydrocarbon groups include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

$R^{b8}$, $R^{b9}$, $R^{b10}$ and $R^{b11}$ are each independently preferably a $C_6$ to $C_{12}$ aromatic hydrocarbon group, more preferably a phenyl group.

Examples of the organic anion for $X1^-$ and $X2^-$ include a sulfonic acid anion, a bis(alkylsulfonyl)amide anion and a tris(alkylsulfonyl) methide anion. The sulfonic acid anion is preferred, and the sulfonic acid anion represented by formula (b10) is more preferred.

(b10)

$$\text{-O}-\underset{\underset{O}{\|}}{\overset{\overset{O}{\|}}{S}}-R^{b12}$$

In the formula, $R^{b12}$ represents a $C_1$ to $C_{18}$ hydrocarbon group where a methylene group may be replaced by an oxygen atom or a carbonyl group.

Examples of $R^{b12}$ include those of $R^{b1}$.

Examples of the compound represented by formula (b9) include the following ones.

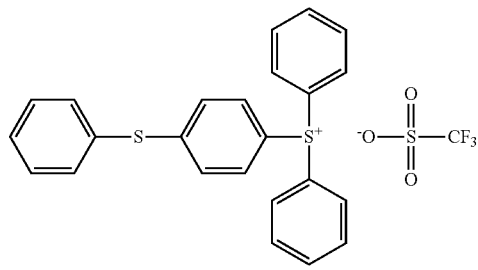

Examples of the compound represented by formula (b10) include the following ones.

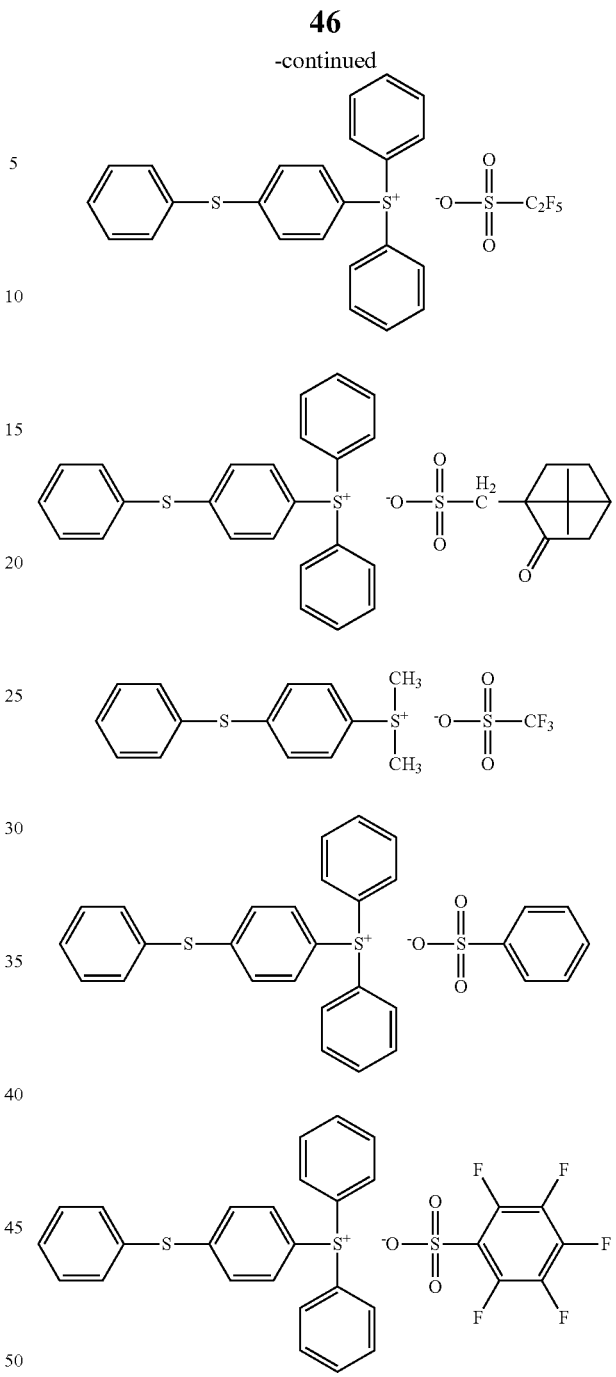

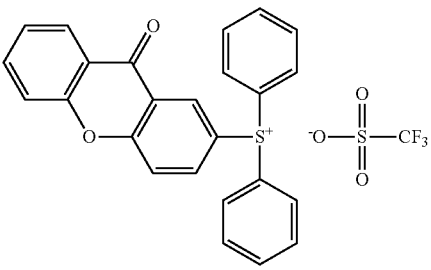

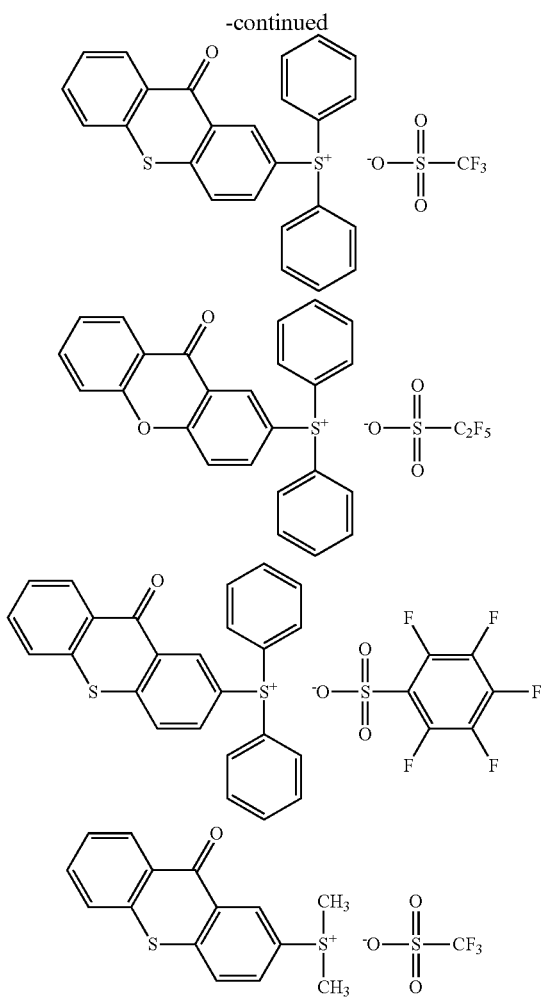

propylthio)ethylene [CH$_2$CH$_2$ (SCH$_2$CH(OH)CH$_2$(OH))$_2$], 3-(2,3-dihydroxypropylthio)-2-methyl-propylsulfonic acid sodium salt [CH$_2$(OH)CH(OH)CH$_2$SCH$_2$CH(CH$_3$)CH$_2$SO$_3$Na], 1-thioglycerol [HSCH$_2$CH(OH)CH$_2$(OH)], 3-mercapto-1-propanesulfonic acid sodium salt [HSCH$_2$CH$_2$CH$_2$SO$_3$Na], 2-mercaptoethanol [HSCH$_2$CH$_2$(OH)], thioglycolic acid [HSCH$_2$CO$_2$H], 3-mercapto-1-propanol [HSCH$_2$CH$_2$CH$_2$].

The sulfur-containing compound is preferably a compound that has a sulfide bond and a mercapto group, more preferably a heterocyclic compound that has a sulfide bond and a mercapto group. There is no particular limitation on how many sulfide bonds and mercapto groups are presented in the sulfur-containing compound, as long as both of these groups are presented respectively therein.

The heterocyclic ring may be a monocyclic or a polycyclic ring, and the ring may be a saturated or an unsaturated ring. The heterocyclic ring preferably has a hetero atom other than a sulfur atom. Examples of the hetero atom include an oxygen atom and a nitrogen atom, and preferably a nitrogen atom.

The heterocyclic ring has preferably 2 to 12 carbon atoms, more preferably 2 to 6 carbon atoms.

The heterocyclic ring is preferably a monocyclic ring or an unsaturated ring, and more preferably a monocyclic unsaturated ring.

Examples of the heterocyclic ring include the following ones.

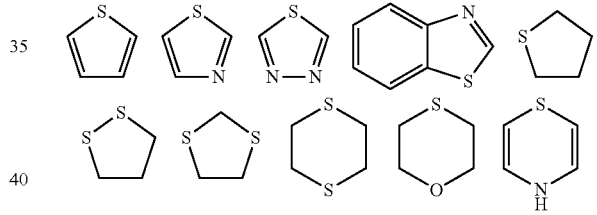

As the acid generator (B), a single salt or a mixture of two or more of the salts can be used.

The content of the acid generator (B) is preferably 0.3 parts by mass or more, preferably 0.5 parts by mass or more, and more preferably 1 parts by mass or more, and preferably 30 parts by mass or less, more preferably 10 parts by mass or less, and still more preferably 5 parts by mass or less, with respect to 100 parts by mass of the resin (A).

<Anticorrosive Agent (G)>

There is no particular limitation on the anticorrosive agent (G) as along as a metal such as aluminum and copper used in a substrate, wiring, or the like can be prevented from corrosion. Preventing corrosion of the metal leads to an effect of anti-rusting. Furthermore, in addition to those effects, the adhesiveness between the resist composition and the substrate or the metal can be improved.

Examples of the anticorrosive agent (G) include a sulfur-containing compound, an aromatic hydroxyl compound, a silicon-containing compound, a benzotriazol compound and a triazine compound. These may be used as a single compound or as a combination of two or more compounds.

Examples of the sulfur-containing compound include a compound that has a sulfide bond and/or a mercapto group, a thiodiazol compound, and a sulfonyl group-substituted nitrogen compound. The sulfur-containing compound may be a chain compound or a compound having a ring structure.

Examples of the chain compound include dithiodiglycolic glycerol [S(CH$_2$CH(OH)CH$_2$(OH))$_2$], bis(2,3-dihydroxy- The sulfur-containing compound may be a polymer. The polymer preferably has a structural unit which has a sulfide bond and a mercapto group in its side chain. A structure having a sulfide bond and a mercapto group (which is sometimes referred to as "unit (1)") and a main chain are preferably bonded together with a linking group such as an amido bond, an ether bond, a thioether bond and ester bond.

The polymer may be a homopolymer or a copolymer.

When the polymer is a copolymer, the copolymer may have the structural unit (a1) and/or the structural unit (s) described above.

The weight average molecular weight of the polymer is usually 3,000 or more, preferably 5,000 or more, while it is usually 100,000 or less, and preferably 50,000 or less.

When the sulfur-containing compound is a polymer, the content of the structural unit which has a sulfide bond and a mercapto group is usually 0.1 to 50 mole %, preferably 0.5 to 30 mole %, and more preferably 1 to 20 mole % with respect to the total structural units of the polymer.

The sulfur-containing compound is preferably a compound represented by formula (IA) or a polymer has a structural unit represented by formula (IB):

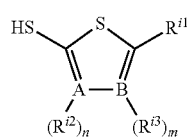

wherein $R^{i1}$ represents a hydrogen atom, a $C_1$ to $C_{10}$ aliphatic hydrocarbon group, a $C_3$ to $C_{18}$ alicyclic hydrocarbon group, a $C_6$ to $C_{14}$ aromatic hydrocarbon group, $-SR^{11}$ or $-N(R^{12})(R^{13})$;

$R^{11}$, $R^{12}$ and $R^{13}$ each independently represent a hydrogen atom, a $C_1$ to $C_{10}$ aliphatic hydrocarbon group, a $C_3$ to $C_{10}$ alicyclic hydrocarbon group, a $C_6$ to $C_{14}$ aromatic hydrocarbon group or a $C_1$ to $C_{12}$ acyl group;

$R^{i2}$ and $R^{i3}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

A and B each independently represent a nitrogen atom or a carbon atom; and

"n" and "m" each independently represent 0 or 1, provided that n is 0 when A is a nitrogen atom, n is 1 when A is a carbon atom, m is 0 when B is a nitrogen atom, and m is 1 when B is a carbon atom.

Examples of aliphatic hydrocarbon group include alkyl groups such as methyl, ethyl, propyl, butyl, pentyl, hexyl, heptyl and octyl groups.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

The alicyclic hydrocarbon group may be a monocyclic or polycyclic group, examples of the alicyclic hydrocarbon group include a cycloalkyl group such as cyclopentyl, cyclohexyl, cycloheptyl and cyclooctyl group, and the polycyclic alicyclic hydrocarbon group such as decahydronaphthyl, adamantyl and norbornyl groups.

$R^{i1}$ is preferably an aliphatic hydrocarbon group or an acyl group, $R^{12}$ and $R^{13}$ are each independently preferably a hydrogen atom, an aliphatic hydrocarbon group, an aromatic hydrocarbon group or an acyl group.

Examples of the acyl group include acetyl, propionyl, butyryl, bareiru, hexylcarbonyl, heptylcarbonyl, octylcarbonyl, decylcarbonyl, dodecylcarbonyl and benzoyl groups.

$R^{i1}$ is more preferably a hydrogen atom or a mercapto group.

$R^{i2}$ and $R^{i3}$ is each independently preferably a hydrogen atom or a $C_1$ to $C_4$ alkyl group, and more preferably a hydrogen atom.

At least one of A and B is preferably a nitro atom, and both of them are more preferably nitrogen atoms.

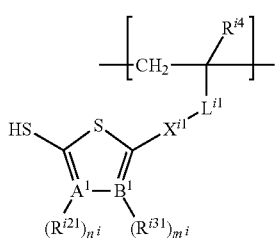

In the formula, $R^{i21}$ and $R^{i31}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^1$ and $B^1$ each independently represent a nitrogen atom or a carbon atom;

$R^{i4}$ represents a hydrogen atom or a methyl group;

$X^{i1}$ represents a sulfur atom or a NH group;

$L^{i1}$ represents a $C_1$ to $C_{20}$ divalent hydrocarbon group where a methylene group may be replaced by an oxygen atom or a carbonyl group; and "$n^i$" and "$m^i$" each independently represent 0 or 1, provided that $n^i$ is 0 when $A^1$ is a nitrogen atom, $n^i$ is 1 when $A^1$ is a carbon atom, $m^i$ is 0 when $B^1$ is a nitrogen atom, and $m^i$ is 1 when $B^1$ is a carbon atom.

Examples of aliphatic hydrocarbon group for $R^{i21}$ and $R^{i31}$ include alkyl groups such as methyl, ethyl, propyl, butyl, pentyl, hexyl, heptyl and octyl groups, preferably a $C_1$ to $C_4$ alkyl group.

Examples of the aromatic hydrocarbon group for $R^{i21}$ and $R^{i31}$ include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups, and preferably a $C_6$ to $C_{10}$ aryl group.

The alicyclic hydrocarbon group for $R^{i21}$ and $R^{i31}$ may be any one of a monocyclic or polycyclic group, examples of the alicyclic hydrocarbon group include a cycloalkyl group such as cyclopentyl, cyclohexyl, cycloheptyl and cyclooctyl group, and the polycyclic alicyclic hydrocarbon group such as decahydronaphthyl, adamantyl and norbornyl groups, and preferably a $C_5$ to $C_{10}$ alicyclic hydrocarbon group.

$R^{i21}$ and $R^{i31}$ are each independently preferably a hydrogen atom or a $C_1$ to $C_4$ alkyl group.

Examples of the divalent hydrocarbon group for $L^{i1}$ include an alkanediyl group such methylene, ethylene, propane-1,3-diyl, butane-1,4-diyl, pentane-1,5-diyl, hexane-1,6-diyl, heptane-1,7-diyl, octane-1,8-iyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl, ethane-1,1-diyl, propane-1,1-diyl, propane-1,2-diyl, propane-2,2-diyl, pentane-2,4-diyl, 2-methylpropane-1,3-diyl, 2-methylpropane-1,2-diyl, pentane-1,4-diyl, 2-methylbutane-1,4-diyl;

a divalent monocyclic saturated alicyclic hydrocarbon group, i.e., a cycloalkanediyl group such as cyclobutane-1,3-diyl, cyclopentane-1,3-diyl, cyclohexane-1,4-diyl, cycloalkanediyl such as cyclooctane-1,5-diyl groups;

a divalent polycyclic saturated alicyclic hydrocarbon group such as a norbornane-1,4-diyl, norbornane-2,5-diyl, adamantane-1,5-diyl and adamantane-2,6-diyl groups an arylene group such as phenylene, tolylene and naphthylene groups.

$L^{i1}$ is preferably a $C_2$ to $C_{14}$ alkanediyl group having an ester bond or a combination of a $C_6$ to $C_{10}$ arylene group with a $C_1$ to $C_{11}$ alkanediyl group.

The structural unit represented by formula (IB) is preferably one represented by formula (IB-1) or formula (IB-2).

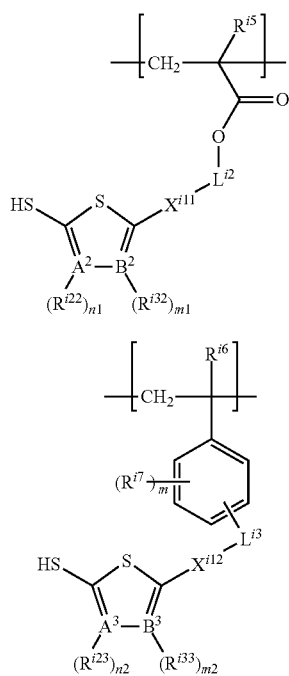

In the formulae, $R^{i22}$ and $R^{i32}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^2$ and $B^2$ each independently represent a nitrogen atom or a carbon atom;

$R^{i5}$ represents a hydrogen atom or a methyl group;

$X^{i11}$ represents a sulfur atom or an NH group;

$L^{i2}$ represents a $C_1$ to $C_{18}$ divalent hydrocarbon group where a methylene group may be replaced by an oxygen atom or a carbonyl group, and "n1" and "m1" each independently represent 0 or 1, provided that "n1" is 0 when $A^2$ is a nitrogen atom, "n1" is 1 when $A^2$ is a carbon atom, "m1" is 0 when $B^2$ is a nitrogen atom and "m1" is 1 when $B^2$ is a carbon atom;

$R^{i23}$ and $R^{i33}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

$A^3$ and $B^3$ each independently represent a nitrogen atom or a carbon atom;

$R^{i7}$ represents a $C_1$ to $C_6$ alkyl group or a $C_1$ to $C_6$ alkoxy group;

$X^{i12}$ represents a sulfur atom and an NH group;

$L^{i3}$ represents a $C_1$ to $C_{14}$ divalent hydrocarbon group where a methylene group may be replaced by an oxygen atom or a carbonyl group; and "n2" and "m2" each independently represent 0 or 1, provided that "n2" is 0 when $A^3$ is a nitrogen atom, "n2" is 1 when $A^3$ is a carbon atom, "m2" is 0 when $B^3$ is a nitrogen atom, and "m2" is 1 when $B^3$ is a carbon atom.

Examples of the $C_1$ to $C_{10}$ aliphatic hydrocarbon group for $R^{i22}$, $R^{i32}$, $R^{i23}$ and $R^{i33}$ each independently include those of $R^{i21}$ and $R^{i31}$.

Examples of the $C_6$ to $C_{14}$ aromatic hydrocarbon group for $R^{i22}$, $R^{i32}$, $R^{i23}$ and $R^{i33}$ each independently include those of $R^{i21}$ and $R^{i31}$.

Examples of the $C_3$ to $C_{18}$ alicyclic hydrocarbon group for $R^{i22}$, $R^{i32}$, $R^{i23}$ and $R^{i33}$ each independently include those of $R^{i21}$ and $R^{i31}$.

Examples of the $C_1$ to $C_{18}$ divalent hydrocarbon group for $L^{i2}$ include an alkanediyl group such as methylene, ethylene, propane-1,3-diyl, butane-1,4-diyl, pentane-1,5-diyl, hexane-1,6-diyl, heptane-1,7-diyl, octane-1,8-diyl, nonane-1,9-diy, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl, ethane-1,1-diyl, propane-1,1-diyl, propane-1,2-diyl, propane-2,2-diyl, pentane-2,4-diyl, 2-methylpropane-1,3-diyl, 2-methylpropane-1,2-diyl, pentane-1,4-diyl and 2-methylbutane-1,4-diyl;

a divalent monocyclic saturated alicyclic hydrocarbon group, i.e., cycloalkanediyl group such as cyclobutane-1,3-diyl, cyclopentane-1,3-diyl, cyclohexane-1,4-diyl, cycloalkanediyl such as cyclooctane-1,5-diyl groups;

a divalent polycyclic saturated alicyclic hydrocarbon group such as a norbornane-1,4-diyl, norbornane-2,5-diyl, adamantane-1,5-diyl and adamantane-2,6-diyl groups; and an arylene group such as phenylene, tolylene and naphthylene groups.

$L^{i2}$ is preferably a $C_1$ to $C_{14}$ alkanediyl group, and more preferably a $C_1$ to $C_{11}$ alkanediyl group.

Examples of the $C_1$ to $C_{14}$ divalent hydrocarbon group for $L^{i3}$ include an alkanediyl group such as methylene, ethylene, propane-1,3-diyl, butane-1,4-diyl, pentane-1,5-diyl, hexane-1,6-diyl, heptane-1,7-diyl, octane-1,8-diyl, nonane-1,9-diy, decane-1,10-diyl, undecane-1,11-diyl, dodecane-1,12-diyl, ethane-1,1-diyl, propane-1,1-diyl, propane-1,2-diyl, propane-2,2-diyl, pentane-2,4-diyl, 2-methylpropane-1,3-diyl, 2-methyl propane-1,2-diyl, pentane-1,4-diyl and 2-methyl butane-1,4-diyl, a divalent monocyclic saturated alicyclic hydrocarbon group, i.e., cycloalkanediyl group such as cyclobutane-1,3-diyl, cyclopentane-1,3-diyl, cyclohexane-1,4-diyl, cycloalkanediyl such as cyclooctane-1,5-diyl groups, and a divalent polycyclic saturated alicyclic hydrocarbon group such as a norbornane-1,4-diyl, norbornane-2,5-diyl, adamantane-1,5-diyl and adamantane-2,6-diyl groups.

$L^{i3}$ is preferably a $C_1$ to $C_{14}$ alkanediyl group, and more preferably a $C_1$ to $C_{11}$ alkanediyl group.

$L^{i3}$ is preferably bonded to a phenylene group so as to form a para-phenylene group.

Examples of the sulfur-containing compound include compounds represented by formulae (I-1) to (I-26), among them, those represented by formulae (I-1) to (I-13) are preferred, and those represented by formulae (I-1), (I-4) and (I-11) are more preferred.

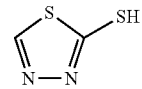

(I-1)

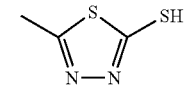

(I-2)

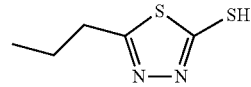

(I-3)

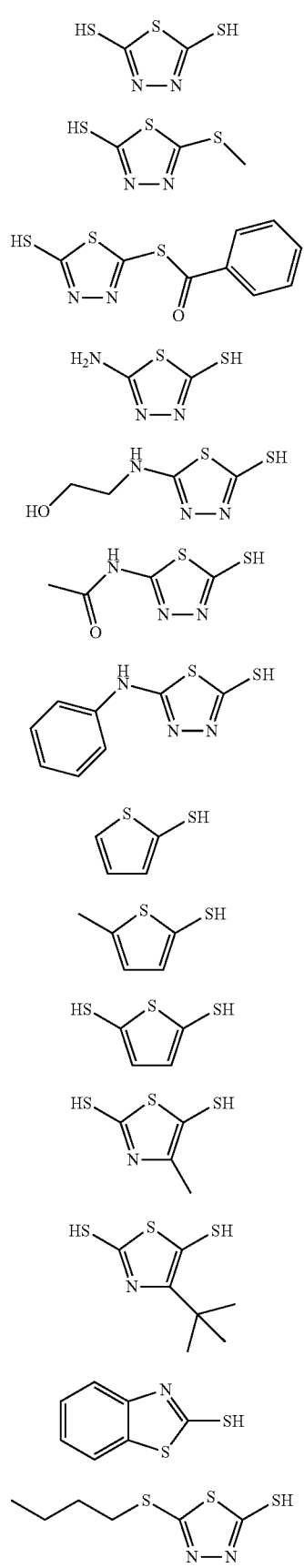
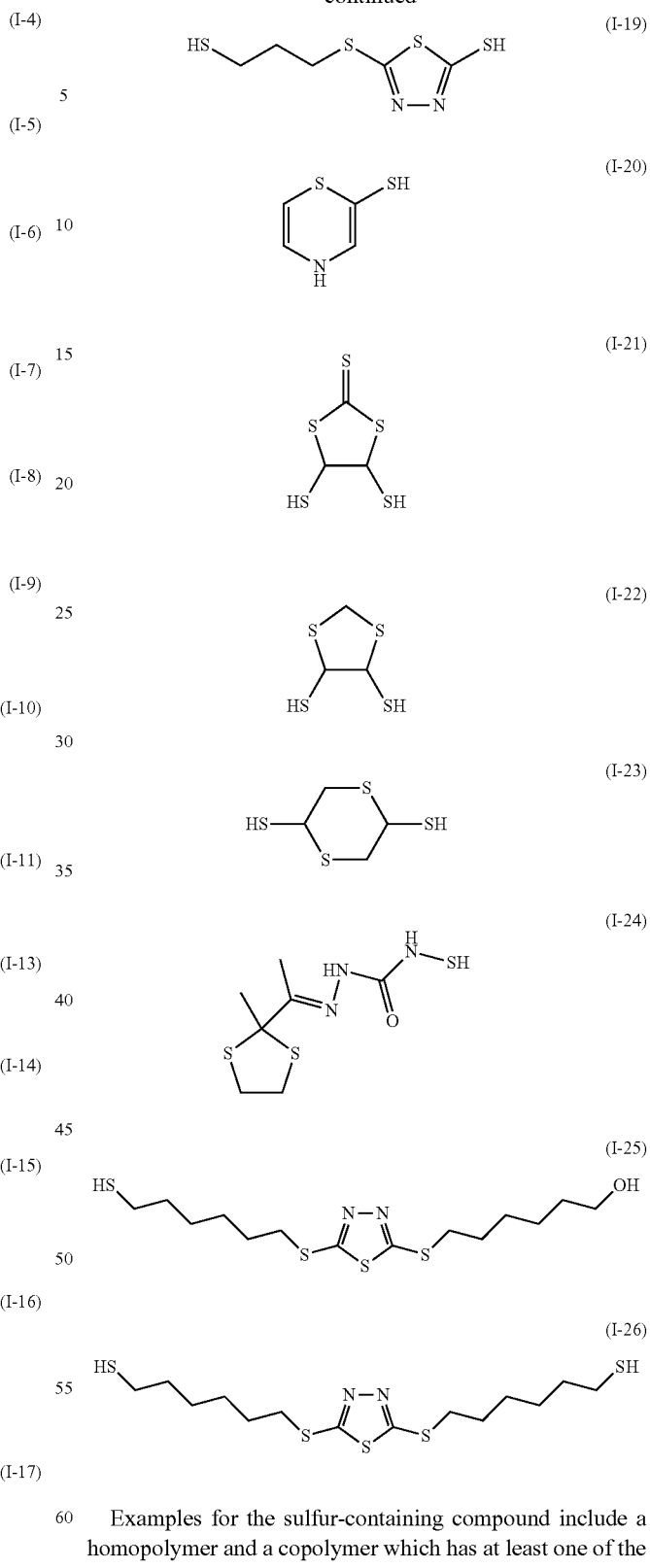

Examples for the sulfur-containing compound include a homopolymer and a copolymer which has at least one of the structural unit represented by any one of formulae (I-27) to (I-38), a copolymer which has at least one of the structural unit represented by any one of formulae (I-27) to (I-36) is preferred, a copolymer which has the structural unit represented by formula (I-33) is more preferred.

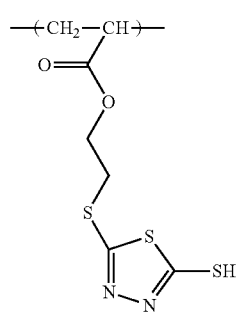 (I-27)
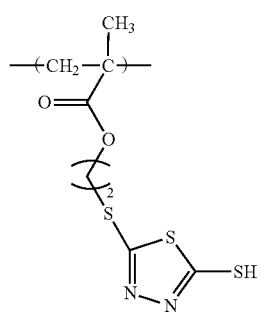 (I-32)
(I-28)
(I-33)
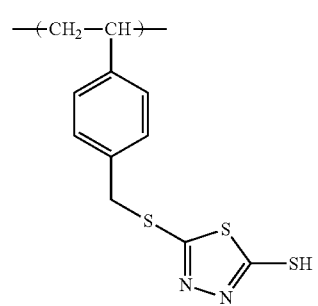
(I-29)
(I-34)
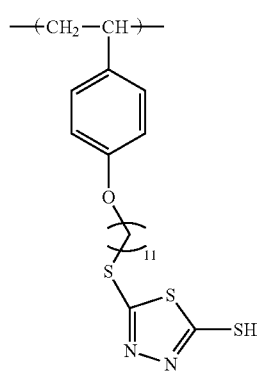
(I-30)
(I-31)
(I-35)
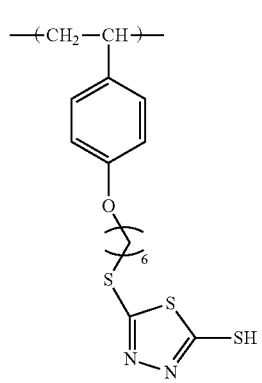

(I-36)
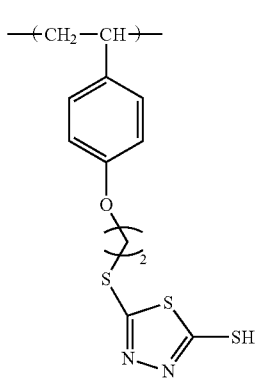
(I-37)
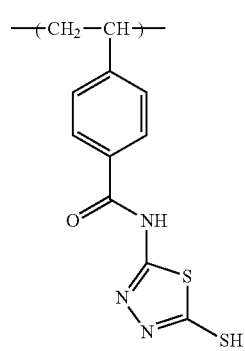
(I-38)
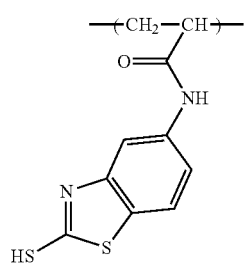
Examples of such copolymer include copolymers represented by formulae (I-39) to (I-48), and a copolymer represented by any one of formulae (I-39) to (I-44) is preferred.
(I-39)
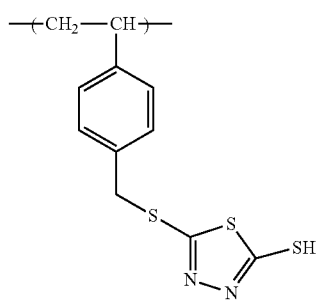 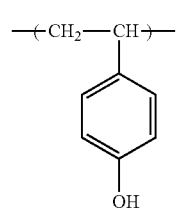
(I-40)
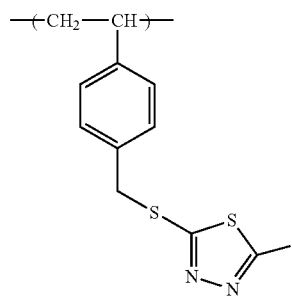
(I-41)
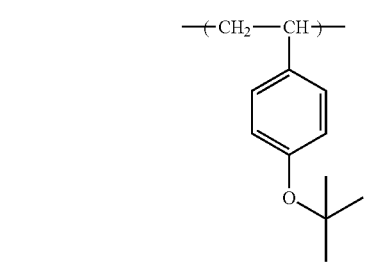
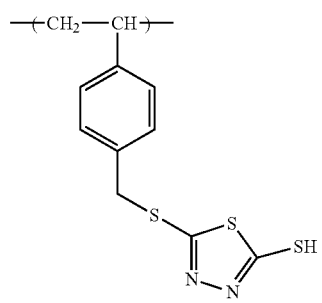
(I-42)
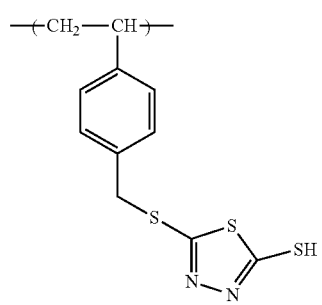 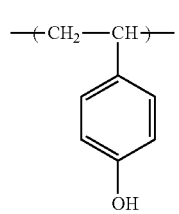

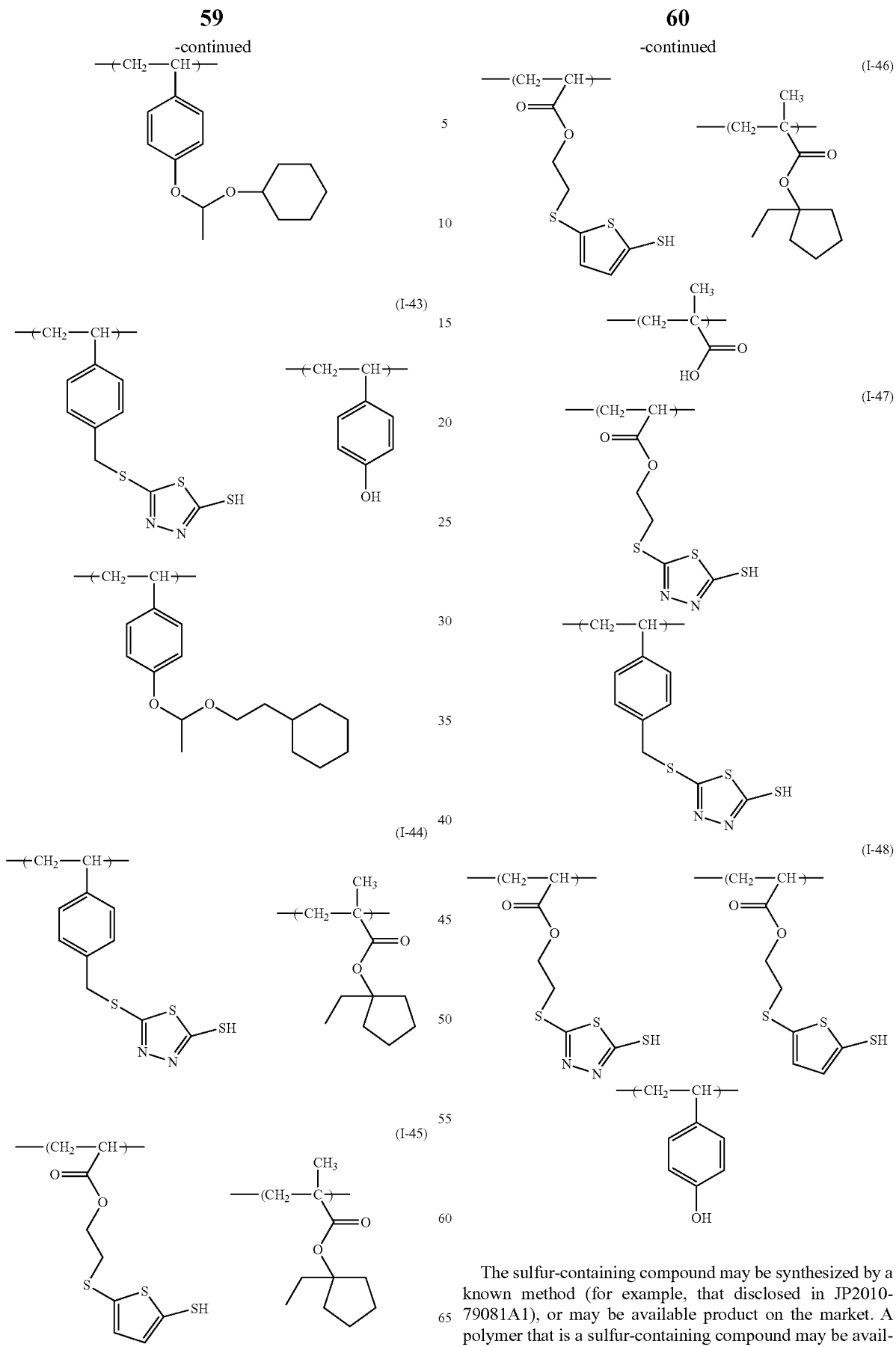
The sulfur-containing compound may be synthesized by a known method (for example, that disclosed in JP2010-79081A1), or may be available product on the market. A polymer that is a sulfur-containing compound may be available product on the market (for example, bismuthiol, manufactured by Tokyo Chemical Industry Co., Ltd.), or may be synthesized by a known method (for example, that disclosed in JP2001-75277A1).

Examples of the aromatic hydroxy compound include phenol, cresol, xylenol, pyrocatechol (=1,2-dihydroxybenzene), tert-butyl catechol, resorcinol, hydroquinone, pyrogallol, 1,2,4-benzene triol, salicyl alcohol, p-hydroxybenzyl alcohol, o-hydroxy benzyl alcohol, p-hydroxy phenethyl alcohol, p-aminophenol, m-aminophenol, diaminophenol, amino resorcinol, p-hydroxybenzoic acid, o-hydroxybenzoic acid, 2,4-dihydroxybenzoic acid, 2,5-dihydroxybenzoic benzoic acid, 3,4-dihydroxybenzoic acid, 3,5-dihydroxybenzoic acid and gallic acid.

Examples of the benzotriazole compound include a compound represented by formula (I):

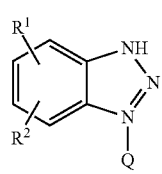

(I)

wherein $R^1$ and $R^2$ each independently represent a hydrogen atom, an optionally substituted $C_1$ to $C_{10}$ hydrocarbon group, a carboxyl group, an amino group, a hydroxyl group, a cyano group, a formyl group, a sulfonyl alkyl group or a sulfone group.

Q represents a hydrogen atom, a hydroxyl group, an optionally substituted $C_1$ to $C_{10}$ hydrocarbon group, an aryl group or a group of **—$R^3$—N($R^4$)—$R^5$, the hydrocarbon group may has an amide bond or an ester bond, $R^3$ represents an alkanediyl group, and

** represents a binding position with a nitrogen atom included the ring.

$R^4$ and $R^5$ each independently represent a hydrogen atom, a hydroxyl group, a $C_1$ to $C_6$ hydroxyalkyl group or a $C_1$ to $C_6$ alkoxyalkyl group.

$R^1$, $R^2$ and Q may be an aliphatic hydrocarbon group or an aromatic hydrocarbon group, and may have a saturated and/or unsaturated bond.

The aliphatic hydrocarbon group is preferably an alkyl group. Examples of the alkyl group include methyl, ethyl, n propyl, isopropyl, n-butyl, sec-butyl, tert-butyl, n-pentyl, methylpentyl, n-hexyl and n-heptyl groups.

The aromatic hydrocarbon group is preferably an aryl group. Examples of the aryl group include phenyl, naphthyl, anthryl, p-methylphenyl, p-tert-butylphenyl, p-adamantylphenyl, tolyl, xylyl, cumenyl, mesityl, biphenyl, phenanthryl, 2, 6-diethylphenyl and 2-methyl-6-ethylphenyl groups.

Examples of the alkanediyl group for $R^3$ include the same examples as the group described above.

Examples of the substituent for the hydrocarbon group include a hydroxyl alkyl and an alkoxyalkyl groups.

Examples of the hydroxylalkyl group include hydroxymethyl and hydroxyethyl groups.

Examples of the alkoxyalkyl group include methoxymethyl, methoxyethyl and dimethoxyethyl groups.

When the resist composition of the disclosure is applied to a substrate that includes copper layer, it is preferred to use a compound in which Q in formula (I) is —$R^3$—N($R^4$)($R^5$). Among them, although the benzotriazole compound in which Q is —$R^3$—N($R^4$)($R^5$) and at least one of $R^4$ and $R^5$ is a $C_1$ to $C_6$ alkyl group exhibits reduced solubility in water when at least one of $R^4$ and $R^5$ is a $C_1$ to $C_6$ alkyl group, the compound is preferably used provided that another component capable of dissolving the compound is present therein.

When the resist composition of the disclosure is applied to a substrate that has an inorganic material layer (for example, polysilicon film and amorphous silicon film), Q in formula (1) preferably is a water soluble group, and more specifically a hydrogen atom, a $C_1$ to $C_3$ alkyl group, a $C_1$ to $C_3$ hydroxyalkyl group or a hydroxyl group. In this manner, the anticorrosive properties of the substrate are effectively enhanced.

Examples of the thiadiazole compound include compounds represented by formulae (III-1) to (III-3).

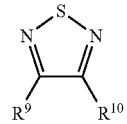

(III-1)

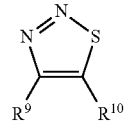

(III-2)

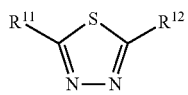

(III-3)

In the formula, $R^9$ and $R^{10}$ each independently represent a hydrogen atom, a halogen atom, a sulfide group, an amino group, a sulfonamido group, a $C_1$ to $C_5$ alkyl group, a $C_1$ to $C_5$ perfluoroalkyl group, an optionally substituted phenyl group, or $R^9$ and $R^{10}$ may be bonded together with a carbon atom bonded thereto to form a ring substituted with a nitro group or an amino group, and $R^{11}$ and $R^{12}$ each independently represent a $C_1$ to $C_5$ alkyl group, a thiol group, a $C_1$ to $C_5$ alkylmercapto group, a sulfonyl group, an amide group, an amino group, a sulfonamide group, an acetyl amino group or a $C_1$ to $C_5$ fluorinated alkyl group.

Examples of the halogen atom include a fluorine, chlorine, bromine and iodine atoms.

Examples of the alkyl group include methyl, ethyl, propyl, n-butyl, tert-butyl and n-pentyl groups.

Examples of the perfluoroalkyl group include perfluoromethyl, perfluoroethyl, perfluoro-propyl, n-perfluorobutyl, tert-perfluorobutyl and n-perfluoropentyl groups.

Examples of the substituent for phenyl group include a halogen atom, an alkyl group, an alkoxy group, a nitro group, an amino group, a phenyl group and a hydroxy group.

Examples of the alkoxy group include methoxy, ethoxy, propoxy, n-butoxy, tert-butoxy and n-pentoxy groups.

Examples of the ring formed from $R^9$ and $R^{10}$ include a benzene ring.

Examples of the alkylmercapto group include methylmercapto, ethylmercapto and propylmercapto groups.

Examples of the fluorinated alkyl group include difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, perfluoropropyl and perfluoropentyl groups.

Specific examples of the compounds represented by formulae (III-1) and (III-2) include 4-aminobenzo-2,1,3-thiadiazole, 4-nitrobenzo-2,1,3-thiadiazole, 3,4-dichloro-1,2,5-thiadiazole, 4,5-diphenyl-1,2,3 thiadiazole and 4-(4-nitrophenyl)-1,2,3-thiadiazole.

Specific examples of the compound represented by formula (I-3) include 2,5-dimercapto-1,3,4-thiadiazole, 5-acetamido-1,3,4-thiadiazole-2-sulfonamide, 2-amino-5-tert-butyl-1,3,4-thiadiazole, 2-amino-5-ethylthio-1,3,4-thiadiazole, 2-amino-5-ethyl-1,3,4-thiadiazole and 2-amino-5-trifluoromethyl-1,3,4-thiadiazole These compounds are available on the market.

Examples of the nitrogen compound substituted with sulfonyl group include compounds represented by formula (IV-1) to formula (IV-5).

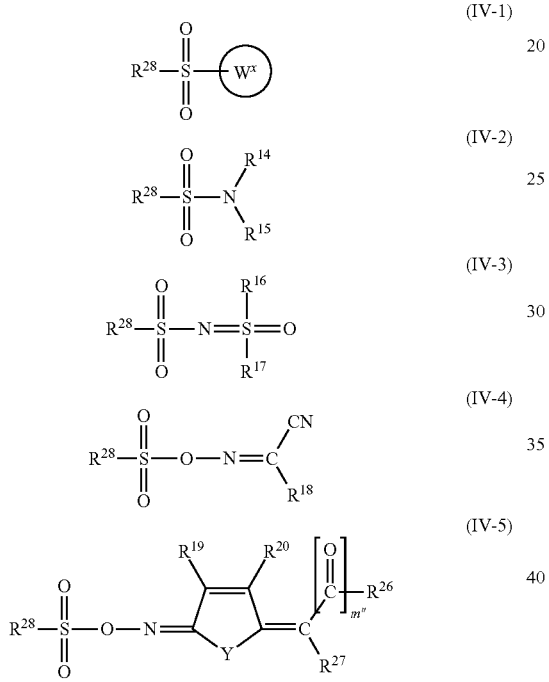

In the formulae, $R^{28}$ represents a hydrogen atom, a $C_1$ to $C_5$ alkyl group, an optionally substituted phenyl group, $-R^{21}OH$, $-R^{22}OR^{23}$, a halogen atom, an amino group, a cyano group, $-R^{24}NH_2$, $-R^{25}CN$ or an optionally substituted indole group, $R^{21}$, $R^{22}$, $R^{24}$ and $R^{25}$ each independently represent an optionally substituted alkanediyl group or a phenylene group, $R^{23}$, $R^{14}$, $R^{16}$ and $R^{17}$ each independently represent an optionally substituted alkyl group or a phenyl group, $W^x$ represents an optionally substituted aromatic heterocyclic group, $R^{15}$ represents a nitroso group or an amino group $R^{18}$ represents a naphtyl group, an optionally substituted phenyl group or an optionally substituted thiophene group, $R^{26}$ and $R^{27}$ each independently represent an optionally substituted phenyl group or a heteroaryl group, an alkoxycarbonyl group, a phenoxycarbonyl group or a cyano group, $R^{19}$ and $R^{20}$ each independently represent a hydrogen atom, a halogen atom, a $C_1$ to $C_6$ alkyl group, a $C_1$ to $C_6$ alkoxy group, a $C_1$ to $C_4$ haloalkyl group, a cyano group, a nitro group, an amino group, a substituted amino group, an alkoxycarbonyl group, a phenoxycarbonyl group, a phenyl group or an alkylthio group, $R^{19}$ and $R^{20}$ may be bonded together with a carbon atom bonded thereto to form a condensed ring, Y represents an atom or an atom group to form a 5-membered or 6-membered heterocycle such as a nitro atom, an oxygen atom, a sulfur atom or a phosphorus atom, or a carbon atom which is needed to form 6-membered hydrocarbon ring, and "m" represent 0 or 1.

Examples of the alkyl group, a substituent of phenyl group, the halogen atom, and alkoxy group include the same examples as the group described above.

Examples of the alkanediyl group include methylene, ethylene, propane-1,3-diyl, ethane-1,1-diyl and propane-1,1-diyl groups.

Examples of the substituent of thiophene include the same examples as the group in phenyl groups.

Examples of the heteroaryl group include pyrrolyl, thienyl, furyl, pyridyl and imidazolyl groups.

Examples of the alkoxycarbonyl group include methoxycarbonyl, ethoxycarbonyl and propoxycarbonyl groups.

Examples of the ring for $W^x$ include the following ones:

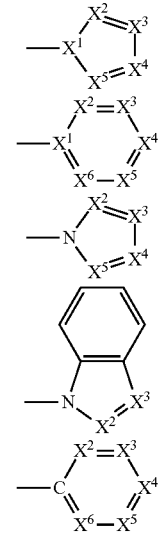

wherein $X^1$ to $X^6$ each independently represent a carbon atom or a nitrogen atom, when adjacent atoms are carbon atoms, substituents of the adjacent carbon atoms may be bonded together with a carbon atom bonded thereto to form a condensed ring, Examples of the compound represented by formula (IV-1) include 1-mesitylenesulfonyl-1,2,4-triazole, N-methanesulfonyl imidazole, 1-(phenylsulfonyl) pyrrole, N-(2,4,6-triisopropyl-benzenesulfonyl) imidazole, 1-(phenylsulfonyl) indole, 1-(2,4,6-triisopropyl-benzenesulfonyl)-1,2,4-triazole, 4-chloro-3-pyridinesulfonamide hydrochloride and 2-pyridine sulfonyl acetonitrile.

Examples of the compounds represented by formula (IV-2) and formula (Iv-3) include N-methyl-N-nitroso-p-toluenesulfonamide and S, S-dimethyl-N-(p-toluenesulfonyl) sulfoximine.

Examples of the compound represented by formula (IV-4) include α-(toluenesulfonyloxyimino)-4-methoxybenzyl cyanide.

Examples of the compound represented by formula (IV-5) include α-(methylsulfonyloxyiminoimino)-thiophene-2-methylbenzyl cyanide.

These compounds are available on the market.

Examples of the benzotriazole compounds include benzotriazole, 5,6-dimethyl benzotriazole, 1-hydroxybenzotriazole, 1-methylbenzotriazole, 1-aminobenzotriazole, 1-phenylbenzotriazole, 1-hydroxymethyl benzotriazole, 1-benzotriazole carboxylic acid methyl ester, 5-benzotriazole carboxylic acid, 1-methoxy-benzotriazole, 1-(2,2-dihydroxy-ethyl)benzotriazole, 1-(2,3-dihydroxypropyl)benzotriazole, or 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane and 2,2'-{[(4-methyl-1H-benzotriazole-1-yl)methyl]imino}bispropane which are available on the market from Ciba Specialty Chemicals as "Irgamet" series.

Examples of the triazine compound include a compound represented by formula (II):

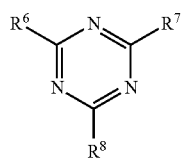

(II)

wherein $R^6$, $R^7$ and $R^8$ each independently represent a halogen atom, a hydrogen atom, a hydroxy group, an amino group, a mercapto group, an optionally substituted $C_1$ to $C_{10}$ hydrocarbon group, an optionally substituted $C_1$ to $C_{10}$ alkyloxy group or an amino group substituted with a $C_1$ to $C_{10}$ hydrocarbon group.

Examples of the halogen group include a fluorine, chlorine, bromine and iodine atoms.

Examples of the hydrocarbon group and an alkyl group include the same examples as the group described above.

Examples of triazine compounds include 1,3,5-triazine-2,4,6-trithiol.

Examples of the silicon-containing compound include a compound represented by formula (IIA):

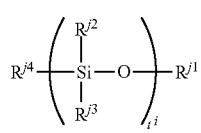

(IIA)

wherein $R^{j1}$ represents a $C_1$ to $C_5$ aliphatic hydrocarbon group or a $C_1$ to $C_5$ mercaptoalkyl group, $R^{j2}$ to $R^{j4}$ each independently represent a $C_1$ to $C_5$ aliphatic hydrocarbon group, a $C_1$ to $C_5$ alkoxy group, a mercapto group or a $C_1$ to $C_5$ mercaptoalkyl group, at least one of $R^{j2}$ to $R^{j4}$ is a mercaptoalkyl group or a $C_1$ to $C_5$ mercapto group, and $t^i$ represents an integer of 1 to 10.

Examples of the aliphatic hydrocarbon group include an alkyl group such as methyl, ethyl, propyl butyl and pentyl groups Examples of the alkoxy group include methoxy and ethoxy groups.

Examples of the mercapto alkyl group include methylmercapto, entylmercapto and puropylmercapto groups.

$R^{j1}$ is preferably a $C_1$ or $C_2$ aliphatic hydrocarbon group and a $C_1$ to $C_3$ mercaptoalkyl group, and more preferably a methyl group or a mercaptopropyl group.

$R^{j2}$ to $R^{j4}$ are each independently preferably a $C_1$ or $C_2$ aliphatic hydrocarbon group, a $C_1$ or $C_2$ alkoxy group, and more preferably a methyl group and a methoxy group. At least one of these is preferably a mercapto group or a $C_1$ to $C_3$, and more preferably a mercapto group or a mercaptopropyl group.

$R^{j2}$ and $R^{j3}$ may be the same or different from each other, and are preferably the same in view of productivity.

Examples of the compound represented by formula (IIA) include the compounds represented by formula (II-1) to formula (II-7).

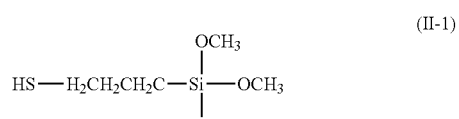

(II-1)

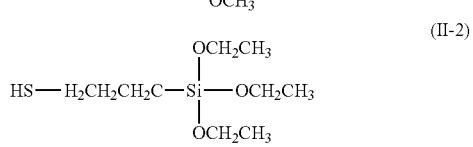

(II-2)

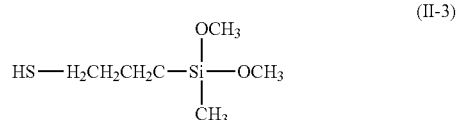

(II-3)

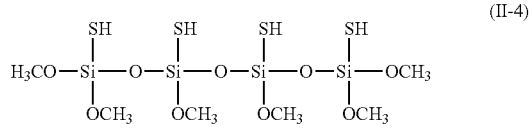

(II-4)

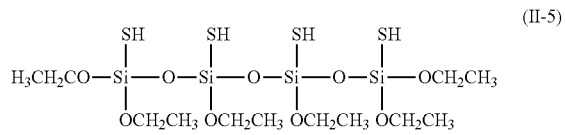

(II-5)

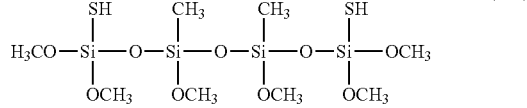

(II-6)

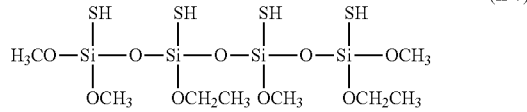

(II-7)

Among them, 3-mercaptopropyl trimethoxysilane and 3-mercaptopropyl triethoxysilane are preferred.

The content of the anticorrosive agent (G) is preferably 0.001% by mass or more, more preferably 0.002% by mass or more, still more preferably 0.005% by mass or more, especially preferably 0.008% by mass or more, and preferably 20 by mass % or less, more preferably 10% by mass or less, more preferably 4% by mass or less, still more preferably 3% by mass or less, especially preferably 1% by mass or less, more preferably especially 0.1% by mass or less, with respect to the total amount of the solid content of the resist composition. The resist composition within this range can form a resist pattern with high accuracy, ensuring the adhesion between the resist pattern and the substrate.

<Solvent (D)>

There is no particular limitation on the solvent (D) as along as it dissolves the components contained in the resist composition of the disclosure, examples of the solvent includes a glycol ether ester such as ethyl cellosolve acetate, methyl cellosolve acetate and propyleneglycolmonomethyl ether acetate; a glycol ether such as propyleneglycolmonomethyl ether; an ester such as ethyl lactate, butyl acetate, amyl acetate and ethyl pyruvate; a ketone such as acetone, methylisobutylketone, 2-heptanone and cyclohexanone; a lactone such as γ-butyrolactone; and a combination thereof.

The content of the solvent is 40 to 75% by mass, preferably 45 to 70% by mass, and more preferably 50 to 68% by mass with respect to total amount of the resist composition of the disclosure. The composition within these ranges of the content can easily provide a resist composition layer having a thickness of about 3 to 50 μm when producing a resist pattern.

<Quencher (C)>

The resist composition of the disclosure preferably further contains a quencher.

Here, the quencher means a compound having a property that it can trap an acid generated from the acid generator by exposure of light. Examples of the quencher include a basic nitrogen-containing organic compound.

Examples of the basic nitrogen-containing organic compound include an amine compound such as an aliphatic amine and an aromatic amine, and an ammonium salt. Examples of the aliphatic amine include a primary amine, a secondary amine and a tertiary amine.

Examples of amine compounds include those represented by the formulae (C1) and (C2).

(C1)

In the formula, $R^{c1}$, $R^{c2}$ and $R^{c3}$ each independently represent a hydrogen atom, a $C_1$ to $C_6$ alkyl group, a $C_5$ to $C_{10}$ alicyclic hydrocarbon group or a $C_6$ to $C_{10}$ aromatic hydrocarbon group, and a hydrogen atom contained in the alkyl group and the alicyclic hydrocarbon group may be replaced by a hydroxy group, an amino group or a $C_1$ to $C_6$ alkoxy group, and a hydrogen atom contained in the aromatic hydrocarbon group may be replaced by a $C_1$ to $C_6$ alkyl group, a $C_1$ to $C_6$ alkoxy group or a $C_5$ to $C_{10}$ alicyclic hydrocarbon group.

Examples of the alkyl group, the alicyclic hydrocarbon group, the aromatic hydrocarbon group, an alkoxy group and an alkanediyl group include the same examples as the group described above.

Examples of the compound represented by the formula (C1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, dibutylmethylamine, methyldipentylamine, dihexylmethylamine, dicyclohexylmethylamine, diheptylmethylamine, methyldioctylamine, methyldinonylamine, didecylmethylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane. Among them, preferred is diisopropylaniline, and more preferred is 2,6-diisopropylaniline.

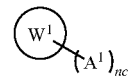

(C2)

In the formula, the ring $W^1$ represents a nitrogen-containing heterocyclic ring, or a benzene ring having a substituted or unsubstituted amino group, and a hydrogen atom in the heterocyclic ring and benzene ring may be replaced by a hydroxy group or a $C_1$ to $C_4$ alkyl group;

$A^1$ represents a phenyl group or a naphthyl group, and "nc" represents an integer of 2 or 3.

The substituted or unsubstituted amino group is represented by $-N(R^{c4})(R^{c5})$, where $R^{c4}$ and $R^{c5}$ each independently represent a hydrogen atom, a $C_1$ to $C_{10}$ aliphatic hydrocarbon group, a $C_3$ to $C_{10}$ alicyclic hydrocarbon group or a $C_6$ to $C_{14}$ aromatic hydrocarbon group.

Examples of the aliphatic hydrocarbon group include an alkyl group such as methyl, ethyl, n-propyl, isopropyl, n-butyl, butyl, pentyl, hexyl, heptyl and octyl groups.

Examples of the alicyclic hydrocarbon group include the same examples as the group described for $R^{a1}$, $R^{a2}$ and $R^{a3}$ in the formula (1), and examples of the aromatic hydrocarbon group include the same examples as the group described for $R^{a1'}$, $R^{a2'}$ and $R^{a3'}$ in the formula (2), described above.

The nitrogen-containing heterocyclic ring is an aromatic or non-aromatic ring, or a ring having a hetero atom other than a nitrogen atom such as an oxygen atom and a sulfur atom. The hetero ring may have 1 to 3 nitrogen atom(s). Examples of the hetero ring include a ring represented by any one of formulae (Y13) to (Y28). In each ring of the formulae, the position where one hydrogen atom has been removed therefrom is a binding position to $A^1$.

(Y13)

(Y14)

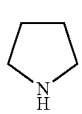

(Y15)

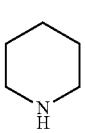

(Y16)

-continued (Y17)

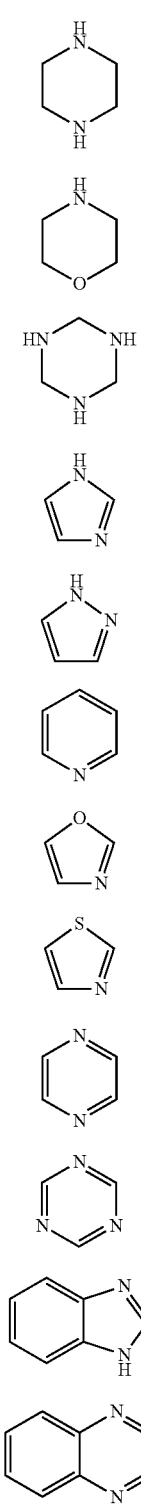

(Y18)

(Y19)

(Y20)

(Y21)

(Y22)

(Y23)

(Y24)

(Y25)

(Y26)

(Y27)

(Y28)

The ring $W^1$ is preferably a nitrogen-containing heterocyclic ring, more preferably a 5- or 6-membered aromatic heterocyclic ring having a nitrogen atom in its ring, and still more preferably a ring represented by any one of formulae (Y20) to (Y25).

Examples of the compound represented by formula (C2) include those represented by formulae (C2-1) to (C2-11), preferably those represented by formulae (C2-2) to (C2-8).

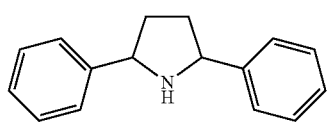

(C2-1)

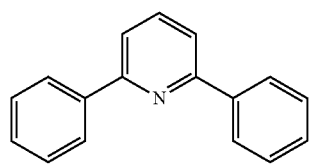

(C2-2)

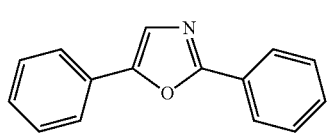

(C2-3)

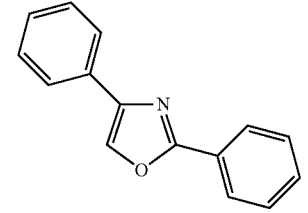

(C2-4)

(C2-5)

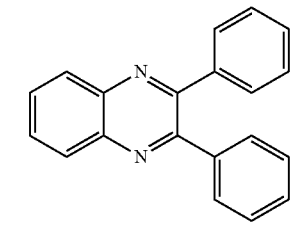

(C2-6)

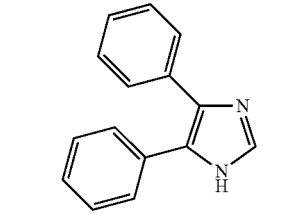

(C2-7)

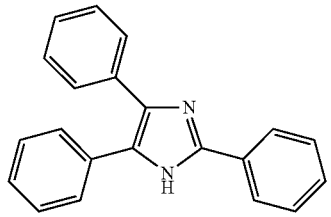

(C2-8)

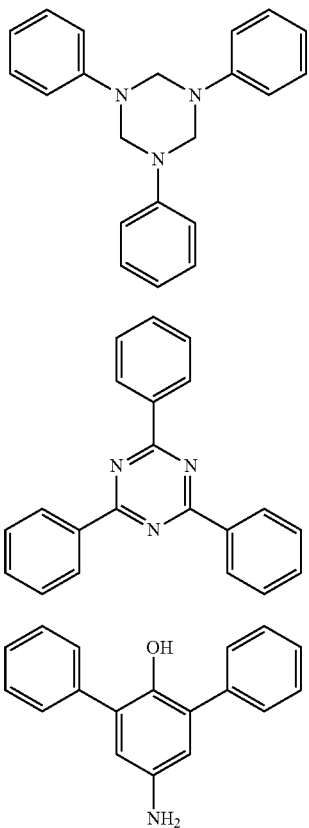

The content of the quencher is preferably 0.01 to 4% by mass, more preferably 0.02 to 3% by mass with respect to the total amount of solid components of the resist composition.

<Other Component (which is Sometimes Referred to as "Other Component (F)")>

The resist composition of the disclosure may contain other components, as needed. Examples of the other component (F) include various additives known in the art such as surfactants, sensitizers, dissolution inhibitors, stabilizers and dyes.

When the other component (F) is used, the content may be adjusted depending upon the kinds thereof.

<Preparing the Resist Composition>

The resist composition can usually be prepared by mixing the resin (A1), the acid generator (B), the anticorrosive agent (G) and the solvent (D) as well as a resin and/or other component (F), as needed.

There is no particular limitation on the order of mixing. The temperature of mixing may be adjusted within the range of 10 to 40° C. The time of mixing may be adjusted within the range of 0.5 to 24 hours. There is no particular limitation to the tool for mixing. An agitation mixing may be used.

After mixing the above components, the mixture may be filtrated through a filter having about 0.11 to 50 μm pore diameter.

<Method for Producing Resist Pattern>

The method for producing a resist pattern of the disclosure includes the steps of:

(1) applying the resist composition of the disclosure onto a substrate;

(2) drying the applied composition to form a composition layer;

(3) exposing the composition layer; and (4) developing the exposed composition layer.

In the step (1), the applying of the composition on a substrate is usually conducted using a conventional apparatus such as spin coater. Examples of the substrate include silicon wafers. A substrate on which semiconductor elements (e.g., a transistor, a diode) has been formed in advance can be used for the process. When the resist composition is to be used for bump formation, a substrate on which a conductive material has been laminated is preferred. Examples of the conductive material include a metal such gold (Au), copper (Cu), nickel (Ni), tin (Sn), palladium (Pd), aluminium (Al) and silver (Ag), and an alloy which contains one or more of these metals. Copper and an alloy containing copper are preferred.

The substrate may be washed or coated with an anti-reflecting layer. For forming the anti-reflecting layer, a composition for an organic anti-reflecting layer as available on the market can be used.

In the step (2), the composition layer is usually formed on the substrate by drying the applied composition to remove the solvent therefrom. The drying is carried out with a heating apparatus such as hot plate (i.e., prebake) for a heat drying, a decompressor for a decompression drying, or a combination thereof.

The temperature is preferably 50 to 200° C., and the operation pressure is preferably 1 to $1.0 \times 10^5$ Pa.

The thickness of the film obtained by step (2) is in the range of preferably 3 to 100 μm, more preferably 3 to 50 μm.

In the step (3), the film is preferably exposed to light using an exposure system. The exposure is usually carried out through a mask having a pattern corresponding to a desired resist pattern. The exposure source can be selected depending on resolution of the intended resist pattern, examples of the exposure source preferably include known one such as a light source emitting a light of 345 to 436 nm of wavelength or a light source emitting a light of 345 to 400 nm of wavelength, more preferably g ray (wavelength: 436 nm), h ray (wavelength: 405 nm) and i ray (wavelength: 365 nm).

The process may further has a step of baking the exposed film, so called post-exposure bake, after the step (3), preferably heating with a heating apparatus. The baking the exposed film can be carried out with heating means such as hot plates. The temperature of baking the exposed film is preferably 50 to 200° C., and more preferably 60 to 120° C. The time of baking is usually 40 to 400 seconds, preferably 50 to 350 seconds.

In the step (4), the development of the exposed resist composition layer is usually carried out. When heating has been carried out, the development of the baked resist composition layer is usually carried out. An alkaline developer is usually used for the development.

Examples of the alkaline developer include an aqueous solution of tetramethylammonium hydroxide or (2-hydroxyethyl)trimethylammonium hydroxide (commonly known as "choline").

After development, the formed resist pattern is preferably washed with ultrapure water, and the remained water on the resist pattern and the substrate is preferably removed.

<Application>

The resist composition of the disclosure is useful for forming a thick film, in particular, for forming a resist film having 3 to 50 μm-thick.

Further, the resist composition is useful for producing bumps. When the bump is produced using the resist composition, bumps can be produced by the process including the following steps;

laminating a conductive material on a wafer which has semiconductor elements thereon to form a conductive film, producing a resist pattern on the conductive film from the composition of the disclosure, plating an electrode material such as Cu, Ni, Au, Sn, Ag or solder, using the resist pattern as its mold, and removing the resist film and the conductive film by etching or the like. After removing the conductive film, the electrode material which has been melted by heating may be used for bumps, as needed.

The resist composition of the disclosure can provide a resist film capable of giving a resist pattern with excellent shape, i.e., excellent rectangularity, and showing high sensitivity and/or resolution, even if it is a thick-film. Further, the resist composition can provide a resist film with hardly cracking, improved adhesion to the substrate, good peeling property after plating, and a suppressed contamination caused by a plating solution.

EXAMPLE

The disclosure will be described more specifically by way of examples, which are not construed to limit the scope of the disclosure.

All percentages and parts expressing the content or amounts used in the Examples and Comparative Examples are based on mass, unless otherwise specified.

The weight average molecular weight is a value determined by gel permeation chromatography.

Apparatus: HLC-8120GPC type (Tosoh Co. Ltd.)
Column: TSK gel Multipore HXL-M×3+guard column (Tosoh Co. Ltd.)
Eluant: tetrahydrofuran
Flow rate: 1.0 mL/min
Detecting device: RI detector
Column temperature: 40° C.
Injection amount: 100 µL
Standard material for calculating molecular weight: standard polystyrene (Tosoh Co. ltd.)

Synthesis Example 1

Synthesis of Novolak Resin A-1-1-1

120 g of phenyl novolak resin (PSM-4326 manufactured by Gun Ei Chemical Industry) was charged into a flask and dissolved in 960 g of methylisobutylketone. The obtained phenyl novolak resin solution was washed 5 times with ion-exchanged water, followed by concentrating the resulting resin solution to 327.3 g. The resin concentration of the resin solution, which was referred to as "the material resin solution 1", was 35.2%. Here, the resin which the material resin solution 1 was sometimes referred to as "material resin 1".

56.8 g of the material resin solution 1 (unit molecular weight: 189 mmol), 76.52 g of methylisobutylketone and 3.6 mg of p-toluenesulfonic acid hydrate (0.0189 mmol) were charged into a flask. 6.54 g of ethylvinylether (0.0907 mmol) was dropped thereto, and then let the reaction of the resin proceed for three hours at room temperature. After the completion of the reaction, ion-exchanged water was added to the reaction solution and then stirred followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, conducting it. After the completion of the removal, the obtained organic layer was concentrated again to obtain 59.77 g of resin solution. The solution contained a resin in which some of the hydroxyl groups of the material resin 1 had been 1-ethoxyethylated. As the result of analysis using $^1$H-NMR, 36.3% of hydroxyl groups with respect to those presented in the material resin 1 were found to have been 1-ethoxyethylated. The concentration of the resulting resin solution was 38.8%, which was determined using a dry mass reduction method. The resin was referred to as resin A-1-1-1. The weight average molecular weight of the novolak resin A-1-1-1 was $5.1 \times 10^3$.

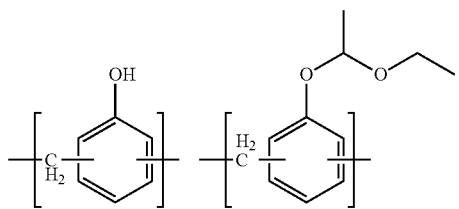

Synthesis Example 2

Synthesis of Novolak Resin A-1-1-2

56.8 g of the material resin solution 1 (unit molecular weight: 189 mmol), 76.52 g of methylisobutylketone and 3.6 mg of p-toluensulfonic acid hydrate (0.0189 mmol) were charged into a flask. Then 7.29 g of ethylvinylether (0.1010 mmol) was dropped thereto, and then the solution let the reaction of the resin proceed for three hours at room temperature. After the completion of the reaction, ion-exchanged water was added to the reaction solution and stirred, followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, conducting it. After the completion of the removal, the obtained organic layer was concentrated again to obtain 51.59 g of resin solution. The resulting solution contained a resin in which some of the hydroxyl groups of the material resin 1 had been 1-ethoxyethylated. As the result of analysis using $^1$H-NMR, 41.8% of hydroxyl groups with respect to those presented in the material resin 1 were found to have been 1-ethoxyethylated. The concentration of the resin solution was 47.3%, which was determined using a dry mass reduction method. The resin was referred to as resin A-1-1-2. The weight average molecular weight of the novolak resin A-1-1-2 was $7.2 \times 10^3$.

Synthesis Example 3

Synthesis of Novolak Resin, A-1-1-3

56.8 g of the material resin solution 1 (unit molecular weight: 189 mmol), 76.52 g of methylisobutylketone and 3.6 mg of p-toluensulfonic acid hydrate (0.0189 mmol) were charged into a flask. 7.79 g of ethylvinylether (0.1080 mmol) was dropped thereinto, and then the solution let the reaction of the material resin proceed for three hours at room temperature. After the completion of the reaction, ion-exchanged water was added to the reaction solution and stirred, followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, conducting it. After the completion of the removal, the obtained organic layer was concentrated again to obtain 55.28 g of resin solution. The resulting solution contained a resin in which some of the hydroxyl groups of the material resin 1 had been 1-ethoxyethylated. As the result of analysis using $^1$H-NMR, 45.5% of hydroxyl groups with respect to those presented in the material resin 1 were found to have been 1-ethoxyethylated. The concentration of the resin solution was 45.0%, which was determined using a dry mass reduction method. The resin was referred to as resin A-1-1-3. The weight average molecular weight of the novolak resin A-1-1-3 was $7.2 \times 10^3$.

Synthesis Example 4

Synthesis of Novolak Resin A-1-1-4

56.8 g of the material resin solution 1 (unit molecular weight: 189 mmol), 76.52 g of methylisobutylketone and 3.6 mg of p-toluensulfonic acid hydrate (0.0189 mmol) were charged into a flask. 8.81 g of ethylvinylether (0.1222 mmol) was dropped thereinto, and then the solution let the reaction of the material resin proceed for three hours at room temperature. After the completion of the reaction, ion-exchanged water was added to the reaction solution and stirred, followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, conducting it. After the completion of the removal, the obtained organic layer was concentrated again to obtain 57.44 g of resin solution. The resulting solution contained a resin in which some of the hydroxyl groups of the material resin 1 had been 1-ethoxyethylated. As the result of analysis using $^1$H-NMR, 53.0% of hydroxyl groups with respect to those presented in the material resin 1 were found to have been 1-ethoxyethylated. The concentration of the resin solution was 45.0%, which was determined using a dry mass reduction method. The resin was referred to as resin A-1-1-4. The weight average molecular weight of the novolak resin A-1-1-4 was $7.2 \times 10^3$.

Synthesis Example 5

Synthesis of Novolak Resin A-1-1-5

80 g of phenyl novolak resin (PSM-4326 manufactured by Gun Ei Chemical Industry) was charged into a flask and dissolved in 640 g of methylisobutylketone. The obtained phenyl novolak resin solution was washed 5 times with ion-exchanged water. The resulting resin solution, which was referred to as "the material resin solution 2", was concentrated to 218 g. The resin concentration of the resin solution was 35.2%. Here, the resin which the material resin solution 2 was sometimes referred to as "material resin 2".

56.8 g of the material resin solution 2 (unit molecular weight: 189 mmol), 76.52 g of methylisobutylketone and 3.6 mg of p-toluensulfonic acid hydrate (0.0189 mmol) were charged into a flask. 6.24 g of isopropyl vinyl ether (72.5 mmol) was dropped into the resin solution, and then the solution let the reaction of the material resin proceed for three hours at room temperature. After the completion of the reaction, ion-exchanged water was added to the reaction solution and stirred, followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, conducting it. After the completion of the removal, the obtained organic layer was concentrated again to obtain 53.4 g of resin solution. The resulting solution contained a resin in which some of the hydroxyl groups of the material resin 2 had been partially 1-isopropyloxyethylated. As the result of analysis using $^1$H-NMR, 29.0% of hydroxyl groups with respect to those presented in the material resin 2 were found to have been 1-isopropyloxyethylated. The concentration of the resin solution was 42.6%, which was determined using a dry mass reduction method. The resin was referred to as resin A-1-1-5.

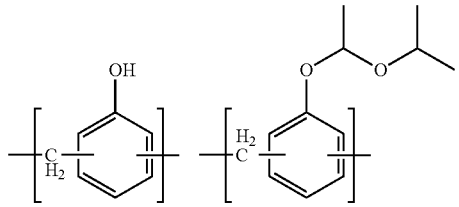

Synthesis Example 6

Synthesis of Novolak Resin A-1-1-6

80 g of phenyl novolak resin (PSM-4326 manufactured by Gun Ei Chemical Industry) was charged into a flask and dissolved in 640 g of methylisobutylketone. The obtained phenyl novolak resin solution was washed 5 times with ion-exchanged water. The resulting resin solution, which was referred to as "the material resin solution 3", was concentrated to 218 g. The resin concentration of the resin solution was 35.2%. Here, the resin which the material resin solution 3 was sometimes referred to as "material resin 3".

56.8 g of the material resin solution 3 (unit molecular weight: 189 mmol), 76.52 g of methylisobutylketone and 3.6 mg of p-toluensulfonic acid hydrate (0.0189 mmol) were charged into a flask. 9.14 g of cyclohexyl vinyl ether (72.5 mmol) was dropped thereinto, and then the solution let the reaction of the material resin proceed for three hours at room temperature. After the completion of the reaction, ion-exchanged water was added to the reaction solution and stirred, followed by setting it stand. Then an organic layer was removed therefrom by separation. Washing by use of the ion-exchanged water was repeated four times, for a total of five times. Thereafter, the organic layer was removed and concentrated. Then, propyleneglycolmonomethyl ether acetate was added thereto for azeotropic removal of the aqueous fraction and methylisobutylketone, and the obtained organic layer was concentrated again to obtain 54.6 g of resin solution. The resulting solution contained a resin in which some of the hydroxyl groups of the material resin 3 had been 1-cyclohexyloxyethylated. As the result of analysis using $^1$H-NMR, 29.0% of hydroxyl groups with respect to those presented in the material resin 3 were found to have been 1-cyclohexyloxyethylated. The concentration of the resin solution was 45.8%, which was determined using a dry mass reduction method. The resin was referred to as resin A-1-1-6.

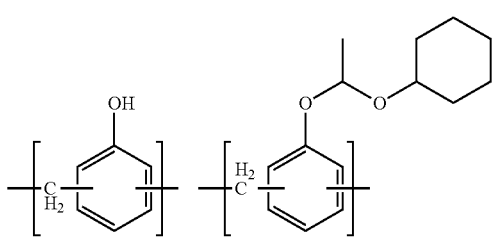

Synthesis Example 7

Synthesis of Resin A-2-1

20 parts of polyvinylphenol [VP-15000; manufactured by Nippon Soda] was dissolved in 240 parts of methylisobutylketone and the obtained solution was concentrated using an evaporator. The concentrated resin solution and 0.003 parts of p-toluenesulfonic acid dihydrate were charged into a four-necked flask provided with a reflux condenser tube, a stirrer and a thermometer. The temperature was maintained at 20 to 25° C. and 5.05 parts of ethylvinylether was dropped over 10 minutes into the resulting mixture. Then the mixture was continuously stirred for two hours while maintaining the same temperature. The resulting reaction mixture was diluted with 200 parts of methylisobutylketone, and then the following steps were conducted five times:washing with ion-exchanged water and then separating an organic layer therefrom. The resulting organic layer was concentrated to 45 parts using an evaporator, 150 parts of propyleneglycolmonomethyl ether acetate were added and re-concentration was carried out to obtain 78 parts of a propyleneglycolmonomethyl ether acetate solution of resin A-2-1 (solid component 29%). The weight average molecular weight of the resin A-2-1 was $1.16 \times 10^4$. The proportion of the introduction of ethoxyethyl groups was 40.9% of hydroxyl groups presented in the polyvinylphenol. The resin A-2-1 had the structural units as shown below.

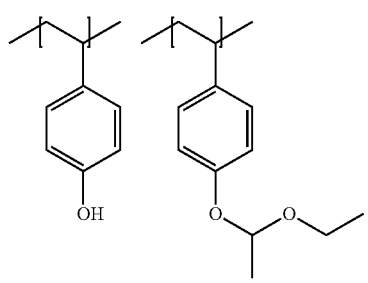

Synthesis Example 8

Synthesis of Resin A-2-2

413.5 parts of 2,5-xylenol, 103.4 parts of salicylaldehyde, 20.1 parts of p-toluensulfonic acid, and 826.9 parts of methanol were charged into a four-necked flask provided with a reflux condenser tube, a stirrer and a thermometer, the temperature was increased until having reached a reflux state, and then the temperature maintained for 4 hours, followed by cooling. Then 1320 parts of methylisobutylketone were charged thereinto, and 1075 parts were distilled at ordinary pressure. Then 762.7 parts of m-cresol and 29.0 parts of 2-tert-butyl-5-methylphenol were added thereto and the temperature was increased to 65° C. Then 678 parts of 37% formalin was dropped thereto over 1.5 hours while the temperature was adjusted to 87° C. Then mixture maintained at 87° C. for 10 hours, followed by adding 1115 parts of methylisobutylketone thereto. Then the following steps were conducted three times: washing with ion-exchanged water and then separating an organic layer therefrom. 500 parts of methylisobutylketone was added to the resulting resin solution, and vacuum concentration was carried out until the total amount reached 3435 parts. 3796 parts of methylisobutylketone and 4990 parts of n-heptane were added to the resulting resin solution, the temperature was increased to 60° C. After one hour stirring, separation was carried out, and then the collected lower layer, that was a resin solution, was diluted using 3500 parts of propyleneglycolmonomethyl ether acetate, and concentrated to obtain 1690 parts of a propyleneglycolmonomethyl ether acetate solution of novolak resin A-2-2 (solid component 43%). The weight average molecular weight of the resin A-2-2 was $7 \times 10^3$.

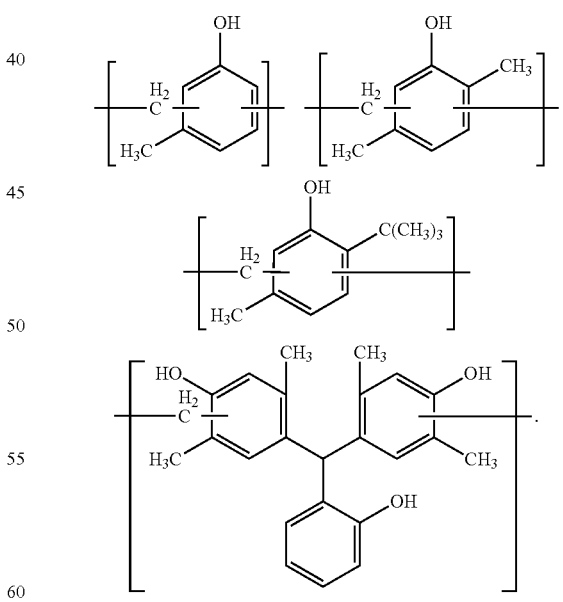

<Preparing Resist Compositions>

Resist compositions were prepared by mixing and dissolving each of the components in the amount (in parts by mass) shown in Tables 1 and 2, and then filtrating through a fluororesin filter having 5.0 μm pore diameter.

TABLE 1

| Ex. | Resin (A) | Acid Generator (B) | Anticorrosive Agent (G) | Solvent (D) | Quencher | Surfactant | PEB |
|---|---|---|---|---|---|---|---|
| 1 | A-1-1-1 = 7.425<br>A-2-2 = 6.075 | 0.24 | 0.016 | 21 | 0.0513 | 0.0019 | — |
| 2 | A-1-1-2 = 7.425<br>A-2-2 = 6.075 | 0.24 | 0.016 | 21 | 0.0513 | 0.0019 | — |
| 3 | A-1-1-3 = 7.425<br>A-2-2 = 6.075 | 0.24 | 0.016 | 21 | 0.0513 | 0.0019 | — |
| 4 | A-1-1-4 = 7.425<br>A-2-2 = 6.075 | 0.24 | 0.016 | 21 | 0.0513 | 0.0019 | — |
| 5 | A-1-1-3 = 7.425<br>A-2-2 = 6.075 | 0.24 | 0.016 | 21 | 0.0513 | 0.0019 | 50° C.<br>60 sec |
| 6 | A-1-1-4 = 7.425<br>A-2-2 = 6.075 | 0.24 | 0.016 | 21 | 0.0513 | 0.0019 | 50° C.<br>60 sec |
| 7 | A-1-1-4 = 7.425<br>A-2-3 = 6.075 | 0.24 | 0.016 | 21 | 0.0513 | 0.0019 | 50° C.<br>60 sec |
| 8 | A-1-1-3 = 7.425<br>A-2-2 = 6.075 | 0.24 | 0.016 | 21 | 0.0513 | 0.0019 | 90° C.<br>60 sec |
| 9 | A-1-1-4 = 7.425<br>A-2-2 = 6.075 | 0.24 | 0.016 | 21 | 0.0513 | 0.0019 | 90° C.<br>60 sec |
| 10 | A-2-1 = 2.7<br>A-1-1-3 = 4.725<br>A-2-2 = 6.075 | 0.24 | 0.016 | 26 | 0.0513 | 0.0019 | — |
| 11 | A-2-1 = 2.7<br>A-1-1-3 = 4.725<br>A-2-2 = 6.075 | 0.24 | 0.016 | 17 | 0.0513 | 0.0019 | — |
| 12 | A-2-1 = 3.7125<br>A-1-1-4 = 3.7125<br>A-2-2 = 6.075 | 0.24 | 0.016 | 17 | 0.0513 | 0.0019 | — |
| 13 | A-2-1 = 3.7125<br>A-1-1-4 = 3.7125<br>A-2-3 = 6.075 | 0.24 | 0.016 | 17 | 0.0513 | 0.0019 | — |
| 14 | A-1-1-5 = 7.425<br>A-2-3 = 6.075 | 0.24 | 0.016 | 22 | 0.0513 | 0.0019 | 50° C.<br>60 sec |
| 15 | A-1-1-6 = 7.425<br>A-2-3 = 6.075 | 0.24 | 0.016 | 22 | 0.0513 | 0.0019 | 50° C.<br>60 sec |

TABLE 2

| Comp. Ex. | Resin (A) | Acid Generator (B) | Anticorrosive Agent (G) | Solvent (D) | Quencher | Surfactant | PEB |
|---|---|---|---|---|---|---|---|
| 1 | A-2-1 = 7.425<br>A-2-2 = 6.075 | 0.24 | — | 21 | 0.0513 | 0.0019 | — |
| 2 | A-2-1 = 7.425<br>A-2-2 = 6.075 | 0.24 | 0.016 | 21 | 0.0513 | 0.0019 | — |
| 3 | A-2-1 = 7.425<br>A-2-2 = 6.075 | 0.24 | 0.016 | 26 | 0.0513 | 0.0019 | — |
| 4 | A-2-1 = 7.425<br>A-2-2 = 6.075 | 0.24 | 0.016 | 17 | 0.0513 | 0.0019 | — |
| 5 | A-2-1 = 7.425<br>A-2-3 = 6.075 | 0.24 | 0.016 | 21 | 0.0513 | 0.0019 | 50° C.<br>60 sec |
| 6 | A-2-1 = 7.425<br>A-2-3 = 6.075 | 0.24 | — | 21 | 0.0513 | 0.0019 | 50° C.<br>60 sec |
| 7 | A-1-1-4 = 7.425<br>A-2-2 = 6.075 | 0.24 | — | 21 | 0.0513 | 0.0019 | 50° C.<br>60 sec |
| 8 | A-1-1-4 = 7.425<br>A-2-3 = 6.075 | 0.24 | — | 21 | 0.0513 | 0.0019 | 50° C.<br>60 sec |
| 9 | A-1-1-5 = 7.425<br>A-2-3 = 6.075 | 0.24 | — | 22 | 0.0513 | 0.0019 | 50° C.<br>60 sec |
| 10 | A-1-1-6 = 7.425<br>A-2-3 = 6.075 | 0.24 | — | 22 | 0.0513 | 0.0019 | 50° C.<br>60 sec |

<Resin>

A-1-1-1: Resin A-1-1-1, A-1-1-2: Resin A-1-1-2, A-1-1-3: Resin, A-1-1-3 A-1-1-4: Resin A-1-1-4, A-1-1-5: Resin A-1-1-5, A-1-1-6: Resin A-1-1-6, A-2-1: Resin A-2-1, A-2-2: Resin A-2-2 and A-2-3: Resin A-2-3.

Resin A-2-3: novolak type phenol resin, Resitop PSF-2803, Gun Ei Chemical Industry, weight average molecular weight: $1.06 \times 10^4$ <Acid Generator>

N-hydroxynaphthalimide triflate, trade name "NAI-105", product by Midori Kagaku, Co., Ltd.

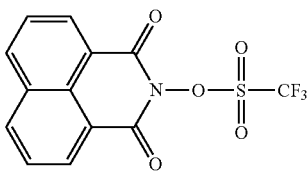 [SMILES: O=C1c2cccc3cccc(c23)C(=O)N1OS(=O)(=O)C(F)(F)F]

<Quencher>

2,4,5-triphenylimidazole (Product of Tokyo Chemical Industry, Co., Ltd.)

<Anticorrosive Agent (G)>

Bismuthiol (Product of Tokyo Chemical Industry, Co., Ltd.)

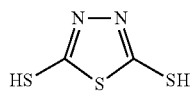

<Solvent>

Propyleneglycolmonomethyl ether acetate

<Surfactant>

Polyether denaturated silicone oil (Toray silicone SH8400; Product of Toray Dow Corming, Co., Ltd.)

<Preparation of Resist Pattern>

On a 4-inches substrate where copper had been vapor-deposited on a silicon wafer, each of the resist compositions prepared as above was spin-coated so that the thickness of the resulting film became 3.5 to 12 μm after pre-baking at 110° C. for 180 seconds.

Using an i-ray stepper ("NSR 2500519A" manufactured by Nikon, NA=0.5) and a mask for forming a line and space pattern with line width of 1 to 5 μm, and pitch: 1 to 5 μm, each wafer thus formed with the respective film was subjected to exposure with the exposure quantity being varied stepwise.

After exposure in Examples 5 to 9, 14 and 15 as well as in Comparative Examples 5 to 9, each wafer was subjected to post-exposure baking on a hotplate at the temperature as shown in the columns "PEB" of Tables 1 and 2 for 60 seconds.

After the completion of the post-exposure baking, each wafer was subjected to paddle development for 60 seconds with an aqueous solution of 2.38 wt % tetramethylammonium hydroxide twice.

The "effective Sensitivity (ES)" means the value of the exposure quantity in the production conducted in the same manner as mentioned above using a mask having 5 μm in line width and formed a pattern having 5 m in the line width.

Resolution:

Each of patterns produced using the process where the exposure had been conducted at the exposure quantity of ES was observed with a scanning electron microscope, the minimum width of the resolved line and space patterns was determined as the value of "resolution".

Crack Resistance Evaluation:

A substrate coated with a resist film [test specimen] was placed on a baking plate at 130° C. for 30 seconds, and then on an iron plate at 23° C. for 30 seconds. These steps were collectively taken to be one cycle. For each test specimen, 3 cycles were conducted. Then, the resulting film was visually confirmed. The specimens where no crack had occurred were denoted as O, and the specimens where a crack had occurred were denoted as X. The results are shown in Table 3.

Adhesiveness:

A substrate having a resist pattern formed thereon was immersed for 30 minutes in a copper plating liquid (Microfab Cu300 manufactured by EEJA) at 25° C., and then visually confirmed using an optical microscope. The resulting substrates which showed a color change caused by eroding the lower portion of the resist pattern were denoted as X, and those which showed no color change were denoted are denoted as O.

The results of the evaluation are listed in Table 3.

TABLE 3

| | Film Thickness (μm) | Resolution (μm) | Crack Resistance | Adhesiveness |
|---|---|---|---|---|
| Ex. 1 | 8 | 3 | o (no crack) | o |
| Ex. 2 | 10 | 2 | o (no crack) | o |
| Ex. 3 | 10 | 2 | o (no crack) | o |
| Ex. 4 | 10 | 2 | o (no crack) | o |
| Ex. 5 | 10 | 2 | o (no crack) | o |
| Ex. 6 | 10 | 2 | o (no crack) | o |
| Ex. 7 | 10 | 2 | o (no crack) | o |
| Ex. 8 | 10 | 2 | o (no crack) | o |
| Ex. 9 | 10 | 2 | o (no crack) | o |
| Ex. 10 | 3.5 | 1 | o (no crack) | o |
| Ex. 11 | 12 | 4 | o (no crack) | o |
| Ex. 12 | 12 | 4 | o (no crack) | o |
| Ex. 13 | 12 | 4 | o (no crack) | o |
| Ex. 14 | 10 | 2 | o (no crack) | o |
| Ex. 15 | 10 | 2 | o (no crack) | o |
| Comp. Ex. 1 | 10 | 2 | x (many cracks) | x |
| Comp. Ex. 2 | 10 | 2 | x (many cracks) | x |
| Comp. Ex. 3 | 3.5 | 2 | x (many cracks) | x |
| Comp. Ex. 4 | 12 | 4 | x (many cracks) | x |
| Comp. Ex. 5 | 10 | 2 | x (many cracks) | o |
| Comp. Ex. 6 | 10 | 2 | x (many cracks) | x |
| Comp. Ex. 7 | 10 | 2 | o (no crack) | x |
| Comp. Ex. 8 | 10 | 2 | o (no crack) | x |
| Comp. Ex. 9 | 10 | 2 | o (no crack) | x |
| Comp. Ex. 10 | 10 | 2 | o (no crack) | x |

The resist composition of the disclosure can provide a resist pattern showing excellent resistance to cracking. Furthermore, the resist composition can provide resist pattern with excellent resolution and shows adhesion firmly to a substrate.

The present resist composition can be used for semiconductor microfabrication with excellent resist patterns.

What is claimed is:

1. A resist composition comprising:
   a novolak resin (A1) having a protective group capable of being cleaved by action of an acid,
   a novolak resin having no protective group,
   an acid generator (B),
   an anticorrosive agent (G), and
   a solvent (D).

2. The resist composition according to claim 1 wherein the resin (A1) has an acetal group.

3. The resist composition according to claim 2 wherein the acetal group has a structure represented by —O—CH(CH$_3$)—O—.

4. The resist composition according to claim 1 wherein the protective group is selected from the group consisting of an ethoxyethyl group, an isopropyloxyethyl group and a cyclohexyloxyethyl group.

5. The resist composition according to claim 1 further comprising a resin that has an acid-labile group and is different from the resin (A1).

6. The resist composition according to claim 1 wherein the anticorrosive agent (G) is at least one selected from the group consisting of a sulfur-containing compound, an aromatic hydroxyl compound, a silicon-containing compound, a benzotriazol compound and a triazine compound.

7. The resist composition according to claim 6 wherein the sulfur-containing compound is a compound having a mercapto group and a sulfide bond.

8. The resist composition according to claim 7 wherein the compound having a mercapto group and a sulfide bond is a compound represented by formula (IA):

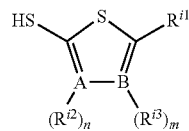

(IA)

wherein $R^{i1}$ represents a hydrogen atom, a $C_1$ to $C_{10}$ aliphatic hydrocarbon group, a $C_3$ to $C_{18}$ alicyclic hydrocarbon group, a $C_6$ to $C_{14}$ aromatic hydrocarbon group, —SR$^{11}$ or —N(R$^{12}$)(R$^{13}$);

$R^{11}$, $R^{12}$ and $R^{13}$ each independently represent a hydrogen atom, a $C_1$ to $C_{10}$ aliphatic hydrocarbon group, a $C_3$ to $C_{10}$ alicyclic hydrocarbon group, a $C_6$ to $C_{14}$ aromatic hydrocarbon group or a $C_1$ to $C_{12}$ acyl group;

$R^{i2}$ and $R^{i3}$ each independently represent a hydrogen atom, a $C_1$ to $C_{10}$ aliphatic hydrocarbon group, a $C_3$ to $C_{18}$ alicyclic hydrocarbon group or a $C_6$ to $C_{14}$ aromatic hydrocarbon group;

A and B each independently represent a nitrogen atom or a carbon atom; and

"n" and "m" each independently represent 0 or 1, or a polymer having a structural unit that has a mercapto group and a sulfide bond in a side chain.

9. A method for producing a resist pattern comprising steps (1) to (4);
   (1) applying the resist composition according to claim 1 onto a substrate;
   (2) drying the applied composition to form a composition layer;
   (3) exposing the composition layer to light; and
   (4) developing the exposed composition layer with an alkali developer.

* * * * *